(12) United States Patent
Tomoyasu et al.

(10) Patent No.: US 7,877,161 B2
(45) Date of Patent: Jan. 25, 2011

(54) METHOD AND SYSTEM FOR PERFORMING A CHEMICAL OXIDE REMOVAL PROCESS

(75) Inventors: Masayuki Tomoyasu, Yamanashi (JP); Merritt Lane Funk, Austin, TX (US); Kevin Augustine Pinto, Austin, TX (US); Masaya Odagiri, Beverly, MA (US); Lemuel Chen, Taoyuan (TW); Asao Yamashita, Wappingers Falls, NY (US); Akira Iwami, Yamanashi (JP); Hiroyuki Takahashi, North Andover, MA (US)

(73) Assignee: Tokyo Electron Limited, Tokyo (JP)

( * ) Notice: Subject to any disclaimer, the term of this patent is extended or adjusted under 35 U.S.C. 154(b) by 1872 days.

(21) Appl. No.: 10/736,983

(22) Filed: Dec. 17, 2003

(65) Prior Publication Data

US 2004/0185583 A1 Sep. 23, 2004

Related U.S. Application Data

(60) Provisional application No. 60/454,597, filed on Mar. 17, 2003, provisional application No. 60/454,642, filed on Mar. 17, 2003, provisional application No. 60/454,641, filed on Mar. 17, 2003, provisional application No. 60/454,644, filed on Mar. 17, 2003.

(51) Int. Cl.
*G06F 19/00* (2006.01)
*H01L 21/302* (2006.01)

(52) U.S. Cl. ............ 700/121; 700/110; 438/8; 438/9; 438/72; 438/680; 438/689; 438/694; 216/73; 216/59; 430/316; 430/30; 430/311

(58) Field of Classification Search .................. 700/121
See application file for complete search history.

(56) References Cited

U.S. PATENT DOCUMENTS 5,240,556 A * 8/1993 Ishikawa et al. .............. 216/67

(Continued)

FOREIGN PATENT DOCUMENTS

JP 2003017471 A 1/2003

(Continued)

OTHER PUBLICATIONS

Natzle et al, "Trimming of Hard Masks by COR for gate length control and fr embedded logic", pp. 1-5, May 2004.*

(Continued)

*Primary Examiner*—Albert Decady
*Assistant Examiner*—Olvin Lopez

(57) ABSTRACT

A processing system and method for chemical oxide removal (COR) is presented, wherein the processing system comprises a first treatment chamber and a second treatment chamber, wherein the first and second treatment chambers are coupled to one another. The first treatment chamber comprises a chemical treatment chamber that provides a temperature controlled chamber, and an independently temperature controlled substrate holder for supporting a substrate for chemical treatment. The substrate is exposed to a gaseous chemistry, such as $HF/NH_3$, under controlled conditions including surface temperature and gas pressure. The second treatment chamber comprises a heat treatment chamber that provides a temperature controlled chamber, thermally insulated from the chemical treatment chamber. The heat treatment chamber provides a substrate holder for controlling the temperature of the substrate to thermally process the chemically treated surfaces on the substrate.

49 Claims, 20 Drawing Sheets

U.S. PATENT DOCUMENTS

| | | | |
|---|---|---|---|
| 5,354,715 A * | 10/1994 | Wang et al. | 438/699 |
| 5,477,975 A * | 12/1995 | Rice et al. | 216/68 |
| 5,542,559 A * | 8/1996 | Kawakami et al. | 216/67 |
| 6,165,805 A | 12/2000 | Steffan et al. | |
| 6,245,581 B1 * | 6/2001 | Bonser et al. | 438/8 |
| 6,438,441 B1 | 8/2002 | Jang et al. | |
| 6,514,667 B2 * | 2/2003 | Angelopoulos et al. | 430/271.1 |
| 6,665,575 B2 * | 12/2003 | Betawar et al. | 700/121 |
| 6,803,246 B2 * | 10/2004 | Mizukami et al. | 438/29 |
| 6,864,041 B2 * | 3/2005 | Brown et al. | 430/316 |
| 6,903,023 B2 * | 6/2005 | Wise et al. | 438/705 |
| 7,042,564 B2 * | 5/2006 | Shoham et al. | 356/237.2 |
| 7,060,626 B2 * | 6/2006 | Bandy et al. | 438/714 |
| 7,328,418 B2 * | 2/2008 | Yamashita et al. | 716/10 |
| 7,337,019 B2 * | 2/2008 | Reiss et al. | 700/21 |
| 2003/0020928 A1 * | 1/2003 | Ritzdorf et al. | 356/630 |
| 2003/0045131 A1 * | 3/2003 | Verbeke et al. | 438/795 |
| 2004/0071888 A1 * | 4/2004 | Chondroudis et al. | 427/402 |
| 2004/0262254 A1 | 12/2004 | Ozawa et al. | |

FOREIGN PATENT DOCUMENTS

| | | | |
|---|---|---|---|
| JP | 2005039185 A | | 2/2005 |
| WO | WO 02/04887 A | | 1/2002 |
| WO | WO 03/021642 A | | 3/2003 |
| WO | WO 2004/084280 A | | 9/2004 |

OTHER PUBLICATIONS

Matthew Sendelbach et al., "Feedforward of mask open measurements on an integrated scatterometer to improve gate linewidth control," Metrology, Insp. and Proc Control for Microlithography XVIII, SPIE, vol. 5375., p. 686-702, (2004).

Japanese Office Action issued in Application No. 2006-545631 mailed Jul. 27, 2010.

Machine English language translation of JP 2005-039185, published Feb. 2005.

Machine English language translation of JP 2003-017471, published Jan. 2003.

Partial English language translation of JP 2003-017471, published Jan. 2003.

Chinese Office Action issued in Application No. 200480038051.8 mailed Mar. 1, 2010 (8 pages).

Chinese Office Action issued in Application No. 200480038051.8 mailed Sep. 12, 2008 (9 pages).

Chinese Office Action issued in Application No. 200480038051.8 mailed Mar. 21, 2008 (27 pages).

International Preliminary Examining Authority, International Preliminary Report on Patentability, International Application No. PCT/US2004/036498, mailed Jun. 20, 2006, (8 pages).

* cited by examiner

Binning Table

Etch Amount(nm) Input for each Control Recipe

Recipe Range: RecipeRangeDemo    [Select]

Bin Table Boundary    Lower 25.0    Upper 35.0    [nm]

| Control Recipe 1 | Control Recipe 2 | Etch 1 | Etch 2 | Etch |
|---|---|---|---|---|
| Nominal | | 30.0 | | 30.0 |
| ControlRecipeA | | 27.0 | | 27.0 |
| ControlRecipeB | | 29.0 | | 29.0 |
| ControlRecipeD | | 32.0 | | 32.0 |
| ControlRecipeE | | 34.0 | | 34.0 |

(Control Recipe will automatically be selected by the input etch amount)

[Select]  [Delete]

Control Recipe Viewer

Description

| | Step 1 | Step 2 | Step 3 | Step 4 | Step 5 | Step 6 | Step 7 |
|---|---|---|---|---|---|---|---|
| StepProcTime [sec] | 2:30.0 | | | | | | |
| ChamberPres [mT] | | 500.0 | | | | | |
| GAS1 [sccm] | | 10.0 | | | | | |
| GAS2 [sccm] | | 40.0 | | | | | |
| GAS3 [sccm] | | | | | | | |

[OK]  [Cancel]

FIG. 10

METHOD AND SYSTEM FOR PERFORMING A CHEMICAL OXIDE REMOVAL PROCESS

CROSS-REFERENCE TO RELATED APPLICATIONS

This application is related to co-pending U.S. Patent Application Ser. No. 60/454,597, entitled "Processing System and Method For Treating a Substrate", co-pending U.S. Patent Application Ser. No. 60/454,642, entitled "Processing System and Method For Chemically Treating a Substrate", filed on Mar. 17, 2003; co-pending U.S. Patent Application Ser. No. 60/454,641, entitled "Processing System and Method For Thermally Treating a Substrate", filed on Mar. 17, 2003; and co-pending U.S. Patent Application Ser. No. 60/454,644, entitled "Method and Apparatus For Thermally Insulating Adjacent Temperature Controlled Chambers". The entire contents of all of those applications are herein incorporated by reference in their entirety.

FIELD OF THE INVENTION

The present invention relates to a system and method for treating a substrate, and more particularly to a system and method for chemical and thermal treatment of a substrate.

BACKGROUND OF THE INVENTION

During semiconductor processing, a (dry) plasma etch process can be utilized to remove or etch material along fine lines or within vias or contacts patterned on a silicon substrate. The plasma etch process generally involves positioning a semiconductor substrate with an overlying, patterned protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride.

During material processing, etching such features generally comprises the transfer of a pattern formed within a mask layer to the underlying film within which the respective features are formed. The mask can comprise a light-sensitive material such as (negative or positive) photo-resist, multiple layers including such layers as photo-resist and an anti-reflective coating (ARC), or a hard mask formed from the transfer of a pattern in a first layer, such as photo-resist, to the underlying hard mask layer.

SUMMARY OF THE INVENTION

The present invention relates to a system and method for treating a substrate, and to a system and method for chemically and thermally treating a substrate.

In one aspect of the invention, a processing system is described for performing material removal on a substrate comprising a first treatment system and a second treatment system, wherein the first and second treatment systems are coupled to one another. The first treatment system comprises a chemical treatment system, wherein the chemical treatment system comprises a chemical treatment chamber, a substrate holder, a vacuum pumping system coupled to the chemical treatment chamber, and a gas distribution system for introducing a process gas into the chemical treatment chamber. The second treatment system comprises a thermal treatment system, wherein the thermal treatment system comprises a temperature controlled thermal treatment chamber, a substrate holder mounted within the thermal treatment chamber, and a vacuum pumping system coupled to the thermal treatment chamber. Selected elements of either of the chambers may be temperature controlled.

Additionally, a method of operating the processing system to treat a substrate is described. The method comprises: transferring the substrate into a chemical treatment; performing at least one of setting, monitoring, and adjusting one or more chemical processing parameters for the chemical treatment system, wherein the one or more chemical processing parameters comprise at least one of a chemical treatment processing pressure, a chemical treatment chamber temperature, a chemical treatment gas distribution system temperature, a chemical treatment substrate temperature, a chemical treatment substrate holder temperature, and a chemical treatment gas flow rate; processing the substrate in the chemical treatment system using the one or more chemical processing parameters; transferring the substrate into the thermal treatment system; performing at least one of setting, monitoring, and adjusting one or more thermal processing parameters for the thermal treatment system, wherein the one or more thermal processing parameters comprise at least one of a thermal treatment processing pressure, a thermal treatment chamber temperature, a thermal treatment substrate temperature, a thermal treatment substrate holder temperature, and a thermal treatment gas flow rate; and processing the substrate in the thermal treatment system using the one or more thermal processing parameters.

BRIEF DESCRIPTION OF THE DRAWINGS

In the accompanying drawings:

FIG. 10 illustrates an exemplary view of a Binning Table screen in accordance with an embodiment of the invention;

DETAILED DESCRIPTION OF SEVERAL EMBODIMENTS

In material processing methodologies, pattern etching comprises the application of a thin layer of light-sensitive material, such as photoresist, to an upper surface of a substrate, that is subsequently patterned in order to provide a mask for transferring this pattern to the underlying material during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a material. For example, when etching features in a material using a hard mask, the mask pattern in the light-sensitive layer is transferred to the hard mask layer using a separate etch step preceding the main etch step for the material. The hard mask can, for example, be selected from several materials for silicon processing including silicon dioxide ($SiO_2$), silicon nitride ($Si_3N_4$), and carbon, for example.

Figure 1:
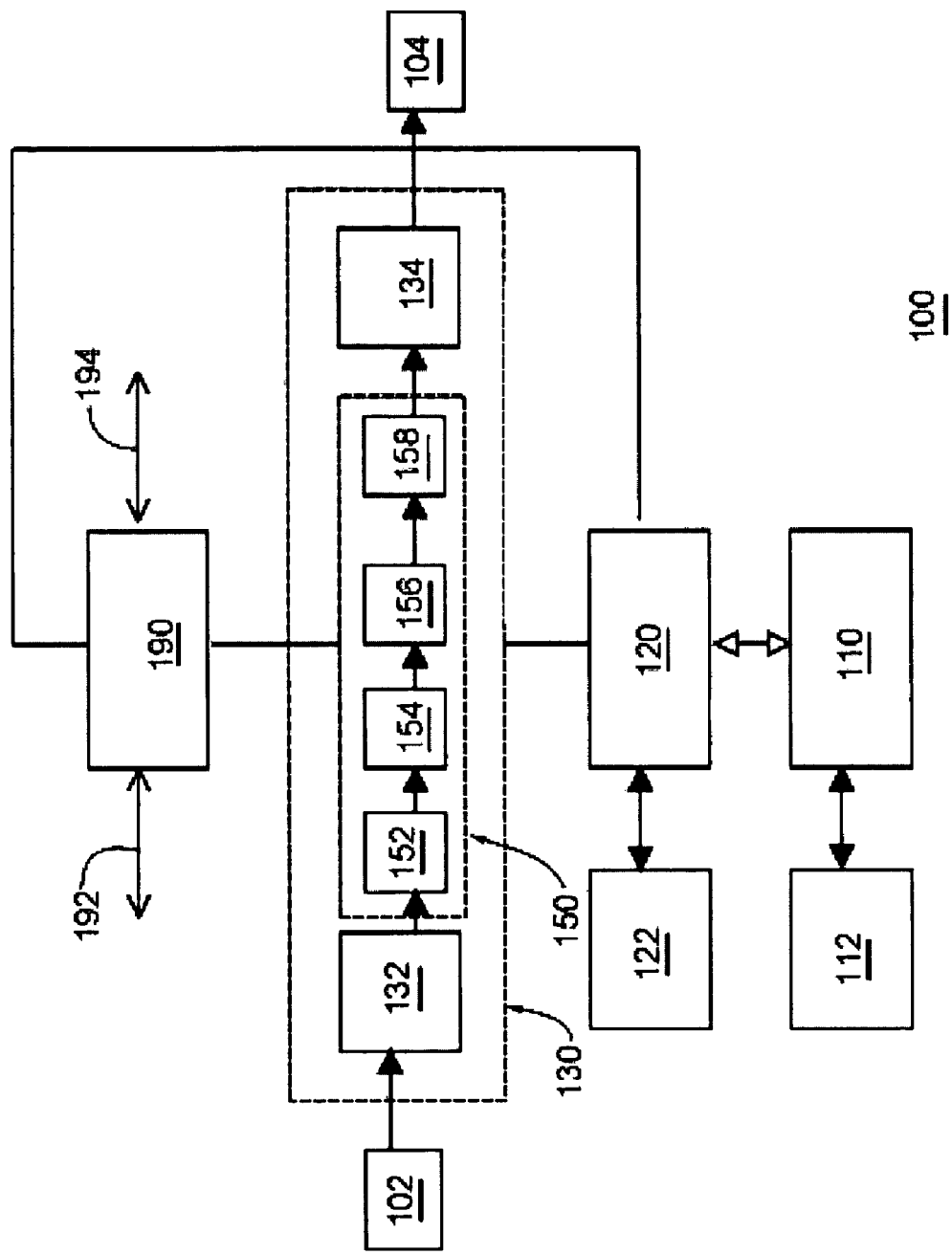
FIG. 1 shows an exemplary block diagram of a processing system in accordance with an embodiment of the present invention.

FIG. 1 shows an exemplary block diagram of a processing system in accordance with an embodiment of the present invention. In the illustrated embodiment, processing system 100 comprises a manufacturing equipment system (MES) 110, a tool level (TL) controller 120 coupled to the MES 110 and a processing tool 130, and a Run-To-Run (R2R) controller 190 coupled to MES 110, TL controller 120, and processing tool 130. In addition, at least one of the MES 110, the TL controller 120, the processing tool 130, and the R2R controller 190 can comprise a GUI component and/or a database component (not shown). In alternate embodiments, the GUI component and/or the database component are not required.

Some setup and/or configuration information can be obtained by the TL controller 120 and/or the R2R controller 190 from the factory system 110. Factory level business rules can be used to establish a control hierarchy. For example, the TL controller 120 and/or the R2R controller 190 can operate independently, or can be controlled to some degree by the factory system 110. Also, factory level business rules can be used to determine when a process is paused and/or stopped, and what is done when a process is paused and/or stopped. In addition, factory level business rules can be used to determine when to change a process and how to change the process.

Business rules can be used to specify the action taken for normal processing and the actions taken on exceptional conditions. The actions can include: initial model loading, pre-etch metrology data filtering, controller recipe selection, post-etch metrology data filtering, Feedback (F/B) calculation, and R2R Model update.

Business rules can be defined at a control strategy level, control plan level or control model level. Business rules can be assigned to execute whenever a particular context is encountered. When a matching context is encountered at a higher level as well as a lower level, the business rules associated with the higher level can be executed. Graphical User Interface (GUI) screens can be used for defining and maintaining the business rules. Business rule definition and assignment can be allowed for users with greater than normal security level. The business rules can be maintained in the database. Documentation and help screens can be provided on how to define, assign, and maintain the business rules.

MES 110 can monitor some system processes using data reported from the databases associated with the TL controller 120 and/or the R2R controller 190. Factory level business rules can be used to determine which processes are monitored and which data is used. For example, the TL controller 120 and/or the R2R controller 190 can independently collect data, or the data collection process can be controlled to some degree by the factory system 110. Also, factory level business rules can be used to determine how to manage the data when a process is changed, paused and/or stopped.

Also, the MES 110 can provide run-time configuration information to the TL controller 120 and/or the R2R controller 190. For example, settings, targets, limits, rules, and algorithms can be downloaded from the factory to the TL controller 120 and/or the R2R controller 190 as an "Advanced Process Control (APC) recipe", an "APC system rule", and "APC recipe parameters" at run-time.

Some setup and/or configuration information can be determined by the TL controller 120 and/or the R2R controller 190 when they are initially configured by the system. System level business rules (system rules) can be used to establish a control hierarchy. For example, the TL controller 120 and/or the R2R controller 190 can operate independently, or the TL controller 120 can be controlled to some degree by the R2R controller 190. Also, system rules can be used to determine when a process is paused and/or stopped, and what is done when a process is paused and/or stopped. In addition, system rules can be used to determine when to change a process and how to change the process. Furthermore, a TL controller 120 can use tool level rules to control some tool level operations.

In general, rules allow system and/or tool operation to change based on the dynamic state of the system.

In FIG. 1, one R2R controller 190, one processing tool 130, and one TL controller 120 are shown, but this is not required for the invention. The semiconductor processing system can comprise any number of processing subsystems having any number of R2R controllers associated with them in addition to independent process tools and modules.

TL controller 120 can be used to configure any number of processing tools having any number of processing subsystems associated with them in addition to any number of independent process tools and modules. The TL controller 120 can collect, provide, process, store, and display data from processes involving processing tools, processing subsystems, process modules, and sensors.

TL controller 120 can comprise a number of applications including at least one tool-related application, at least one module-related application, at least one sensor-related application, at least one interface-related application, at least one database-related application, at least one GUI-related application, and at least one configuration application.

For example, the TL controller 120 and R2R controller 190 can support an APC system from Tokyo Electron Limited that can include a Unity Tool, Telius Tool and/or a Trias Tool and their associated processing subsystems and process modules. Alternately, the TL controller 120 can support other process tools and other process modules.

A GUI component can provide easy to use interfaces that enable users to: view tool status and process module status; create and edit x-y charts of summary and raw (trace) parametric data for selected wafers; view tool alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate Principal Component Analysis (PCA) and/or Partial Least Squares (PLS) models; and/or view diagnostics screens in order to troubleshoot and report problems with the TL controller 120.

Raw data and trace data from the tool can be stored as files in the database 122. In addition, Integrated Metrology (IM) data and host metrology data can be stored in the database 122. The amount of data depends on the data collection plans that are configured, as well as the frequency with which processes are performed and processing tools are run. The data obtained from the processing tools, the processing chambers, the sensors, and the operating system can be stored in the database.

In the illustrated embodiment shown in FIG. 1, a single client workstation 112 is shown but this is not required for the invention. The system can support a plurality of client workstations 112. In one embodiment, the client workstation 112 allows a user to perform configuration procedures; to view status including tool, R2R controller, process, and factory status; to view current and historical data; to perform modeling and charting functions; and/or to input data to the R2R controller. For example, a user may be provided with administrative rights that allow him to control one or more processes performed by a R2R controller.

R2R controller 190 comprises link 192 for coupling to at least one other R2R controller that is associated with a process that has been performed before this process and link 194 for coupling to at least one other R2R controller that is associated with a process that is performed after this process. Link 192 and link 194 can be used to feed forward and/or feed back information.

R2R controller 190 is coupled to MES 110 and can be part of an E-Diagnostic System. The R2R controller 190 can exchange information with a factory system. In addition, the MES 110 can send command and/or override information to the R2R controller 190. For example, the MES 110 can feed-forward to the R2R controller downloadable recipes for any number of process modules, tools, and measuring devices, with variable parameters for each recipe. Variable parameters can include final Critical Dimension (CD) targets, limits, offsets, and variables in the tool level system that need to be adjustable by lot. Also, factory litho CD metrology data can be feed-forwarded to R2R controller 190.

Furthermore, the MES 110 can be used to provide measurement data, such as CD Scanning Electron Microscope (SEM) information, to the R2R controller. Alternately, the CD SEM information can be provided manually. Adjustment factors are used to adjust for any offset between the IM and CD SEM measurements. Manual and automated input of CD SEM data includes a timestamp, such as a date, for proper insertion in to the history of the Feedback (FB) control loop in the R2R controller.

Configurable items can be configured as a set of variable parameters sent from the factory system using Generic Equipment Model/SEMI Equipment Communications Standard (GEM SECS) communications protocol. For example, variable parameters can be passed as part of an "APC Recipe". An APC recipe may contain more than one sub recipes and each sub recipe can contain variable parameters.

R2R controller 190 is coupled to processing tool 130 and TL controller 120. Information can include feedback and feed-forward data. For example, when an internal reset event is being generated from the tool, the R2R controller 190 can send a message, such as an alarm, to the MES 110. This would allow the factory system to make the necessary changes to minimize the number of wafers at risk after a major change occurs such as those that occur during corrective or preventative maintenance.

In the illustrated embodiment, a processing tool 130 is shown that comprises a first integrated metrology module (IMM) 132, a processing subsystem 150, and second IMM 134, but this is not required for the invention. Alternately, other configurations can be used.

A single R2R controller 190 is also shown in FIG. 1, but this is not required for the invention. Alternately, additional R2R controllers can be used. For example, R2R controller 190 can comprise at least one of a feed-forward (FF) controller, process model controller, feedback (FB) controller, and process controller (all not shown in FIG. 1).

In the illustrated embodiment, a start event 102 provides an input for a first IMM 132. For example, a start event can be a message from a host that includes a data and/or control message. The first IMM 132 is coupled to a R2R controller 190 and a processing subsystem 150. The processing subsystem 150 is coupled to R2R controller 190, and a second IMM 134. The second IMM 134 is coupled to R2R controller 190.

The processing subsystem 150 can comprise a first buffer module 152, a Chemical Oxide Removal (COR) module 154, a Post Heat Treatment (PHT) chamber 156, and a second buffer module 158. The COR module performs the first step of the COR process. The first step can be a reaction between a mixture of process gases, such as HF and ammonia gases and silicon dioxide, which forms a solid reaction product on the wafer surface. The PHT module, located next to the COR module, performs the second step of the COR process. This step causes the evaporation of the solid reaction product by heating the wafer.

Processing subsystem 150 can comprise a process ship that can include a COR module, a PHT module, and a buffer (LL) module. The processing system can be controlled using a separate processing recipes the COR module, the PHT module, the buffer (LL) module.

For example, a buffer module can comprise a transfer system for transferring a wafer between the COR module, the PHT module, the buffer (LL) module, and another module, such as another transfer system module. These process modules can be included as additional module types for the TL controller to control.

The processing subsystem can use a COR recipe to start the processing and a COR recipe can begin when a substrate is transferred to the COR module. For example, the substrate can be received by lift pins that are housed within a substrate holder, and the substrate can be lowered to the substrate holder. Thereafter, the substrate can be secured to the substrate holder using a clamping system, such as an electrostatic clamping system, and a heat transfer gas can be supplied to the backside of the substrate.

Next, the COR recipe can be used to set one or more chemical processing parameters for the chemical treatment of the substrate, and these parameters can include at least one of a chemical treatment processing pressure, a chemical treatment wall temperature, a chemical treatment substrate holder temperature, a chemical treatment substrate temperature, a chemical treatment gas distribution system temperature, a chemical treatment processing chemistry, including process gasses and flows. Then, the substrate can be chemically treated for a first period of time. The first period of time can range from 30 to 360 seconds, for example.

Next, the substrate can be transferred from the chemical treatment chamber to the PHT module. During which time, the substrate clamp can be removed, and the flow of heat transfer gas to the backside of the substrate can be terminated. The substrate can be vertically lifted from the substrate holder to the transfer plane using the lift pin assembly housed within the substrate holder. The transfer system can receive the substrate from the lift pins and can position the substrate within the PHT module. Therein, the substrate lifter assembly can receive the substrate from the transfer system, and can lower the substrate to the substrate holder.

Then, the PHT recipe can be used to set one or more thermal processing parameters for thermal treatment of the substrate by the PHT module can be set and the substrate can thermally treated for a second period of time. For example, the one or more thermal processing parameters can comprise at least one of a thermal treatment wall temperature, a thermal treatment upper assembly temperature, a thermal treatment substrate temperature, a thermal treatment substrate holder temperature, a thermal treatment substrate temperature, a thermal treatment processing pressure, and a thermal treatment processing chemistry, including process gasses and flows. The second period of time can range from 30 to 360 seconds, for example.

In an exemplary process, the processing subsystem 150 can be a chemical oxide removal (COR) system for trimming an oxide hard mask. In another exemplary process, an oxidized Tunable Etch Resistant ARC (TERA) film can be trimmed using a COR process. The processing subsystem 150 comprises a COR module 154 for chemically treating exposed surface layers, such as oxide surface layers, on a substrate, whereby adsorption of the process chemistry on the exposed surfaces affects a chemical alteration of the surface layers. Additionally, the processing subsystem 150 comprises a PHT module 156 for thermally treating the substrate, whereby the substrate temperature is elevated in order to desorb (or evaporate) the chemically altered exposed surface layers on the substrate.

For example, the COR module can use a process gas comprising HF and $NH_3$, and the processing pressure can range from approximately 1 to approximately 100 mTorr and, for example, can range from approximately 2 to approximately 25 mTorr. The process gas flow rates can range from approximately 1 to approximately 200 sccm for each specie and, for example, can range from approximately 10 to approximately 100 sccm. In addition, a uniform (three-dimensional) pressure field can be achieved. Additionally, the COR module chamber can be heated to a temperature ranging from 30° to 100° C. and, for example, the temperature can be approximately 40° C. Additionally, the gas distribution system can be heated to a temperature ranging from approximately 40° to approximately 100° C. and, for example, the temperature can be approximately 50° C. The substrate can be maintained at a temperature ranging from approximately 10° to approximately 50° C. and, for example, the substrate temperature can be approximately 20° C.

In addition, in the PHT module, the thermal treatment chamber can be heated to a temperature ranging from approximately 50° to approximately 100° C. and, for example, the temperature can be approximately 80° C. Additionally, the upper assembly can be heated to a temperature ranging from approximately 50° to approximately 100° C. and, for example, the temperature can be approximately 80° C. The substrate can be heated to a temperature in excess of approximately 100° C. Alternatively, the substrate can be heated in a range from approximately 100° to approximately 200° C., and, for example, the temperature can be approximately 135° C.

The COR and PHT processes described herein can produce an etch amount of an exposed oxide surface layer in excess of approximately 10 nm per 60 seconds of chemical treatment for thermal oxide, an etch amount of the exposed oxide surface layer in excess of approximately 25 nm per 180 seconds of chemical treatment for thermal oxide, and an etch amount of the exposed oxide surface layer in excess of approximately 10 nm per 180 seconds of chemical treatment for TEOS. The treatments can also produce an etch variation across the substrate of less than approximately 2.5%.

The start event 102 can be a wafer in event, and the start event can comprise data associated with the in-coming wafer. This data can include lot data, batch data, run data, composition data, and wafer history data. Alternately, the start event can be a different process-related event.

The first IMM 132 can provide pre-process metrology data that can be used to establish an input state for a wafer. The first IMM 132 can provide (feed-forward) a first part of the pre-process metrology data to the R2R controller 190, and can provide a second part of the pre-process metrology data to the processing subsystem 150. Alternately, the two parts can comprise the same data. The first IMM 132 can comprise a single IMM or multiple measurement devices. The first IMM 132 can include module-related measurement devices, tool-related measurement devices, and external measurement devices. For example, data can be obtained from sensors coupled to one or more process modules and sensors coupled to the processing tool. In addition, data can be obtained from an external device such as a SEM tool and an Optical Digital Profiling (ODP) tool. An ODP tool is available for Timbre Technologies Inc. (a TEL company) that provides a patented technique for measuring the profile of a feature in a semiconductor device.

The R2R controller 190 can use the difference between a measured critical dimension of the incoming material (input state) and a target critical dimension (desired state) to predict, select, or calculate a set of process parameters to achieve the desired result of changing the state of the wafer from the input state to the desired state. For example, this predicted set of process parameters can be a first estimate of a recipe to use based on an input state and a desired state. In one embodiment, data such the input state and/or the desired state data can be obtained from a host.

In one case, the R2R controller 190 knows the input state and desired state for the wafer, and the R2R controller 190 determines a set of recipes that can be performed on the wafer to change the wafer from the input state to the desired state.

For example, the set of recipes can describe a multi-step process involving a set of process modules.

The R2R controller 190 can use table-based techniques, and a rule for determining when to switch between techniques can be based on at least one of an input range, an output range, a wafer type, a process type, a module type, a tool type, a wafer state, and a process state. For example, the recipes can be in a table, and the R2R controller 190 does a table lookup to determine which recipe or recipes to use.

When the R2R controller uses table-based techniques, the feed-forward control variables can be configurable. For example, a variable can be a constant or coefficient in the table. In addition, there can be multiple tables, and a rule for determining when to switch between tables can be based on an input range or an output range.

The time constant for the R2R controller is based on the time between measurements. When measured data is available after a lot is completed, the R2R controller's time constant can be based on the time between lots. When measured data is available after a wafer is completed, the R2R controller's time constant can be based on the time between wafers. When measurement data is provided real-time during processing, the R2R controller's time constant can be based on processing steps, within a wafer. When measured data is available while a wafer is being processed or after a wafer is completed or after the lot is completed, the R2R controller can have multiple time constants that can be based on the time between process steps, between wafers, and/or between lots.

One or more R2R controller can be operating at any point in time. For example, one R2R controller can be in an operating mode while a second R2R controller can be in a monitoring mode. In addition, another R2R controller can be operating in a simulation mode. A R2R controller can comprise a single loop or multiple loops, and the loops can have different time constants. For example, loops can be dependent on wafer timing, lot timing, batch timing, chamber timing, tool timing, and/or factory timing.

The R2R controller can operate as a single input single output (SISO) device, as a single input multiple output (SIMO) device, as a multiple input single output (MISO) device, and as a multiple input multiple output (MIMO) device. In addition, inputs and outputs can be within a R2R controller and/or between one or more R2R controllers. For example, when multiple inputs such as CD and sidewall angle are being used, inputs and outputs can be fed forward and backward between two modules, (i.e., one for CD control and one for sidewall angle control). In addition, a mask open controller can also be used. In a multi-process case including multiple modules, information can be fed-forward or fed-back from one R2R controller to another R2R controller.

The processing subsystem 150 can comprise at least one of: an etch module, a deposition module, a polishing module, a coating module, a developing module, and a thermal treatment module.

When a processing tool and/or process module sends data to the database, this data can be accessed by the R2R controller. For example, this data can comprise tool trace data, maintenance data, and EPD data. The trace data can provide important information about the process. The trace data can be updated and stored during processing, or after the processing of a wafer is completed.

The R2R controller 190 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. Also, models can include SPC charts, PLS models, PCA models, Fitness Distance Correlation (FDC) models, and Multivariate Analysis (MVA) models.

The R2R controller can receive and utilize externally provided data for process parameter limits in a process module. For example, the R2R controller GUI component provides a means for the manual input of the process parameter limits. In addition, a factory level controller can provide limits for process parameters for each process module.

The R2R controller can receive and execute models created by commercially available modeling software. For example, the R2R controller can receive and execute models (PLS, PCA, etc.) that were created by external applications and sent to the controller.

The second IMM 134 can provide post-process metrology data that can be used to establish an output state for a wafer. The second IMM 134 can provide (feedback) a first part of the post-process metrology data to the R2R controller 190, and can provide a second part of the post-process metrology data to the database along with wafer out event 104. Alternately, the two parts can comprise the same data. The second IMM 134 can comprise a single IMM or multiple measurement devices. The second IMM 134 can include process module-related measurement devices, tool-related measurement devices, and external measurement devices. For example, data can be obtained from sensors coupled to one or more process modules and sensors coupled to the processing tool. In addition, data can be obtained from an external device such as a SEM tool, an Optical Emission Spectroscopy (OES) tool, and an ODP tool.

The R2R controller 190 can use the post-process metrology data from the second IMM 134 to compute a first set of process deviations. This computed set of process deviations can be determined based on an anticipated wafer state and the output state for the wafer determined from the post-process metrology data. In one case, the R2R controller 190 knows the desired state and output state for the wafer, and the R2R controller 190 determines the differences between the desired state and the output state. In this manner, the measured actual process results are compared with the desired process results in order to determine a correction to the process recipe. In another case, the R2R controller 190 knows the predicted state and output state for the wafer, and the R2R controller 190 determines the differences between the predicted state and the output state. In this manner, the measured actual process results are compared with the predicted process results in order to determine a correction to the process model.

In some cases, the R2R controller does not need to use a lookup table method to adjust a target CD. For example, a simple delta between a factory provided target CD and a filtered metrology CD can be applied as a correction.

Model updates are another form of feedback that can take place by running monitor wafers, varying the process settings and observing the results, then updating the model. For example a model update can take place every N processing hours by measuring the before and after film characteristics of a monitor wafer. By changing the settings over time to check different operating regions one could validate the complete operating space over time, or run several monitor wafers at once with different recipe settings. The model update can take place within the R2R controller at the tool or at the factory, allowing the factory control to manage the monitor wafers and model updates.

The R2R controller 190 computes an updated recipe for the next wafer. In one case, the R2R controller 190 can use the feed-forward information, modeling information, and the feedback information to determine whether or not to change the current recipe before running the current wafer. In another case, the R2R controller 190 can use the feed-forward information, modeling information, and the feedback information to determine whether or not to change the current recipe before running the next wafer. Alternately, the R2R controller 190 can use the feed-forward information, modeling information, and the feedback information to determine whether or not to change the current recipe before running the next lot.

The R2R controller 190 can comprise one or more filters (not shown) to filter the metrology data in order to remove the random noise. For example, a filter can be applied to the input or to the output of a controller. In one case, the filter can be applied to the incoming variable for filtering without concern of the method of control (i.e., independent of using a lookup table). This also enables the controller to change output variables over a range of control, such as changing a flow rate in small steps, then making a change in pressure and stair stepping a flow rate change.

An outlier filter can be used to remove outliers that are statically not valid and should not be considered in the calculation of the mean of a wafer measurement. The outlier filter can be used to eliminate both high and low outliers from the mean. For example, a box and whisker method can be applied to the site metrology data. This method is effective, is simple to maintain without absolute limits, allows one set of filtering limits to be applied to a varying set of incoming CD mean data (the target can change without effecting the filter limits) and is simple to visualize. With an outlier filter additional rules need to be maintained (minimum number of points in a wafer to statically represent the wafer and the minimum number of wafers to represent a lot.)

A noise filter can be used to remove random noise and stabilize the control loop, an Exponentially Weighed Moving Average (EWMA) or Kalman filter can be applied. When a filter is used, the filter time constant has to be set (in case of EWMA, lambda is the time constant). For example, EWMA calculations can be made using the complete history each time in order to capture data points that are added out of order, by processing date and time.

The R2R controller can receive and utilize feed forward data. For example, the R2R controller can receive information about incoming material to be processed and the desired process results (target CD), and the R2R controller can provide a set of recipe parameters to achieve the desired process results. The R2R controller can receive and utilize feedback data. For example, the R2R controller can receive information about material that has already been processed and adjust the process model based on this data. The R2R controller can receive and utilize feedback data that is delayed. For example, the R2R controller can receive information about material that has already been processed and adjust the process model based on this data even though the data is not received in the order in which it was processed by the tool. The R2R controller can receive and utilize manually entered data for configuring and controlling the controller. For example, the R2R controller GUI component provides a means for the manual input of the controller configuration information.

The R2R controller can send and receive notification of exception condition. For example, the R2R controller can send and receive notifications to and from a factory level controller or a tool level controller. In addition, a notification can be sent via the e-Diagnostics network, e-mail, or pager after the identification of an exception condition.

The R2R controller can run in a simulated mode. For example, the R2R controller can operate in simulation mode in parallel with the actual process mode. In this case, the simulated actions can be recorded in the R2R controller log and historical database, and immediate action is not taken.

The process model not only provides input parameters for gas flow rates but also provides input parameters for gas flow rate ratio. For example, the R2R controller can calculate and establish a gas flow ratio and adjust the total flow of the combined gases.

The R2R controller can select process models based on incoming material context. For example, the R2R controller can select process models based on the incoming material state and process recipe. The R2R controller can comprise means to verify that the system can calculate a valid R2R setting. For example, the R2R controller can comprise means to verify recipe parameter settings prior to lot start. The R2R controller can comprise means to use default settings of recipe set points. For example, when the R2R controller cannot provide recipe parameters for a particular wafer, the recipe parameters in the "nominal" recipe can be used.

The R2R controller can comprise a database component for archiving input and output data. For example, the R2R controller can archive received inputs, sent outputs, and actions taken by the controller in a searchable database. In addition, The R2R controller can comprise means for data backup and restoration. Also, the searchable database can include model information, configuration information, and historical information and the R2R controller can use the database component to backup and restore model information and model configuration information both historical and current.

The R2R controller can comprise a web based user interface. For example, the R2R controller can comprise a web enabled GUI component for viewing the data in the database. The R2R controller can comprise a security component that can provide for multiple levels of access depending on the permissions granted by a security administrator. The R2R controller can comprise a set of default models that are provided at installation time, so that the R2R controller can reset to default conditions.

The R2R controller can take various actions in response to an exception, depending on the nature of the exception. For example, exception conditions can include: missing measured data, missing target CD, metrology error, recipe parameter limit exceeded, process module parameter limit exceeded, and/or feedback event received out of order. The actions taken on exception can be based on the business rules established for the context specified by the system recipe, process recipe, module type, module identification number, load port number, cassette number, lot number, control job ID, process job ID and/or slot number, for example. The context can be arranged in a hierarchy from the highest level to the lowest level. Matching a context at a higher level can override matching a context at a lower level. If no matching context is found the default action can be taken.

The R2R controller inputs can include Instructions, substrate state, module physical state, process state, and/or controller parameters. In addition, the R2R controller inputs can include time constants for feed-forward/feedback loops, a reset event for accumulation, an IMM step, and ODP offset. Instructions can include targets, tolerances, computational commands, data collection plans, algorithms, models, coefficients, and/or recipes. The substrate state can include information from the substrate being processed (site, wafer, lot, batch state), profiles, and/or characteristics measured physically or electrically. The module physical state can include the current or last known recorded state of the module and components that will be used to process the substrate—RF hours, number of wafers, and/or consumable states. The process state can include the current or last known measured state from sensors of the processing environment, including trace data, and/or summary statistics. The controller parameters can include the last settings for the recipe/controller set points and process targets that created the substrate state, module physical state, and/or process state.

The R2R controller outputs can include the following items: derived parameters, settings, an event or message, intervention, derived context, log message, and/or history. For example, data to be sent to offline systems for analysis. The derived parameters can include information generated by the controller that can represent the state of the controller, the process, the material, and/or the equipment. Settings can include process tool parameters that are calculated by the R2R controller and are typically downloaded to the tool at runtime. For example these parameters can include time by step, pressure, temp, gas flows, and/or power. An event or message can include information indicating that an exception has occurred in the system being controlled. Intervention can include information concerning an action that is recommended (or taken) by the R2R controller based on analysis results. Derived context can include context information that is derived by the R2R controller. The log message can be a text message describing the activities of the R2R controller. The history item can include data to be sent to offline systems for a Decision Support System (DSS) type of analysis.

The R2R controller can comprise at least one computer and software that supports at least one controller application. The R2R controller can comprise at least one storage device that stores data. For example, at least one computer can run operational software, such as the Ingenio software, from Tokyo Electron. In one case, the operational software can perform at least one of: configuration, data management, fault management, trouble-shooting, and interfacing through a GUI. Configuration GUI screens can be used to configure the interface between the computer and the processing element, to determine the device type for the processing element (e.g., tool, module, sensor, etc.). Data management GUI screens can be used to determine the amount and type of data to collect, and to determine how to and where to store the collected data. Furthermore, fault management GUI screens can be used to inform a user about fault conditions.

Figure 2:
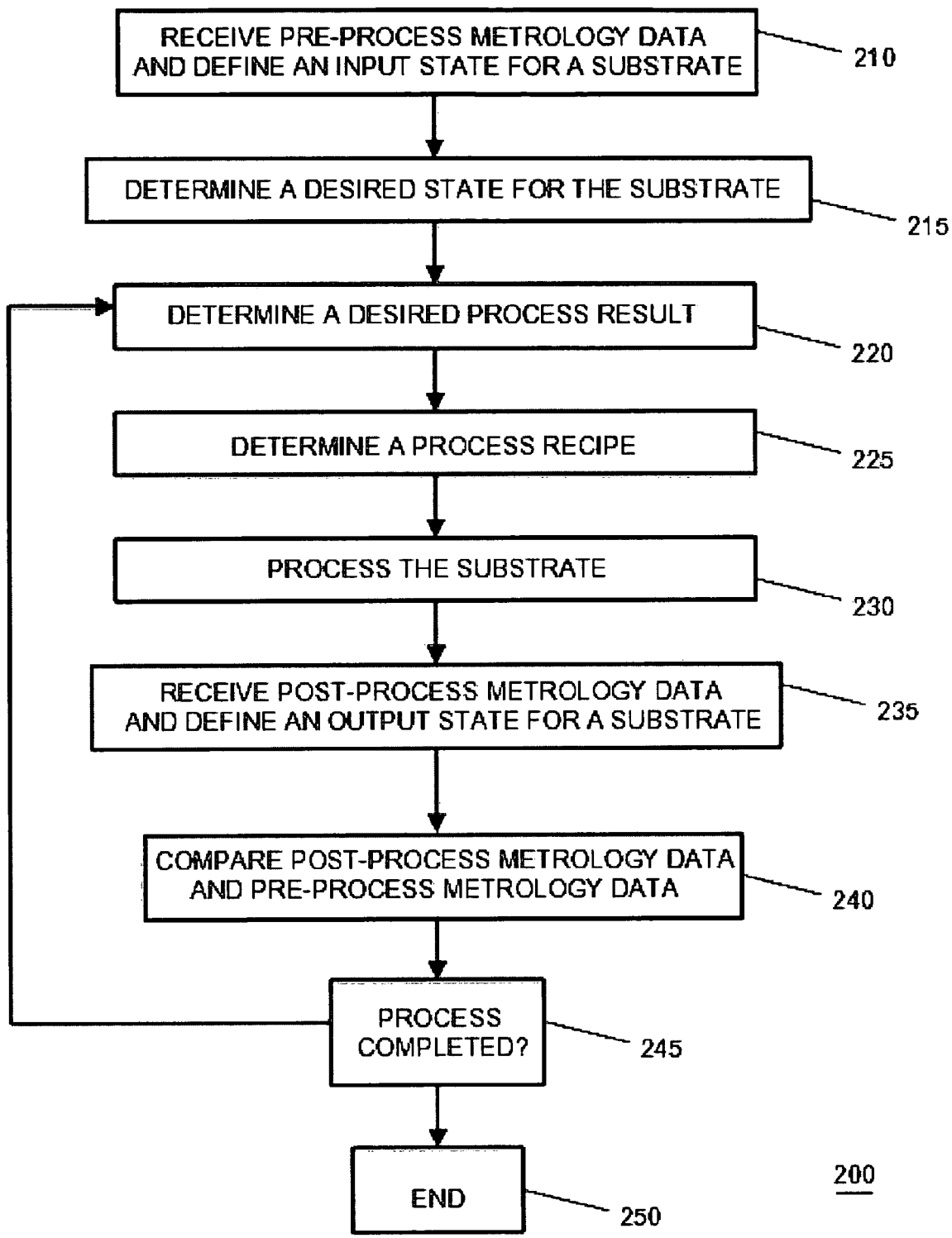
FIG. 2 illustrates an exemplary flow diagram of a method for operating a processing system in accordance with an embodiment of the invention.

FIG. 2 illustrates an exemplary flow diagram of a method for operating a processing system in accordance with an embodiment of the invention.

In 210, pre-process metrology data is obtained. Metrology data can comprise site measurement data and/or wafer data. For example, site measurement data can include: Goodness Of Fit (GOF), grating thickness, CD, material thickness, material cross section area, trench cross section area, sidewall angle, differential width, site result, and/or site number. Wafer data can include: CD measurement flag, number of measurement site, recipe result, coordinate X, and/or coordinate Y. In addition, pre-process metrology data can comprise isolated CD data for at least one isolated feature and nested CD data for at least one nested feature, and a process recipe can be determined by comparing the isolated CD data and the nested CD data to the target CD. For example, a first trimming process can be performed based on the difference between the isolated CD data and the target CD data; and a second trimming process based on the difference between the nested CD data and the target CD data. Furthermore, a first delta can be determined based on the difference between CD data for a first feature and the target CD data; a second delta can be determined based on the difference between CD data for a second feature and the target CD data; and a trimming process can be performed based on the difference between the first delta and the second delta.

Pre-process metrology data can be used for feed forward control. Also, the site measurement data can be summarized as the statistical value for the control wafer according to some business rules.

The pre-process metrology data can be filtered. For example, an outlier rejection filter can be used to remove data points on a wafer that are outliers and are statistically invalid. In other words, those sites that are not reliable can be thrown away and not used in the wafer mean calculation.

In one case, a Mean/Sigma comparison method can be used on the pre-process metrology data. For example, a sigma multiplier, X can be specified; all data points can be summarized into a mean and a sigma; two limits can be calculated (mean+X times sigma and mean−X times sigma); all data points outside the limits can be removed; the mean can be recalculated and can represent the final IM measurement. Alternately, outliers can be identified using a box and whisker plot methodology.

In 215, one or more desired output parameter(s) can be provided that can be used to determine a desired state for a substrate. For example, a target CD can be provided and the CD to be controlled must be known in advance. In other words, the control position identification between to-be-controlled CD and target CD must be consistent. Because the to-be-controlled CD is defined by the to-be-controlled process, the target CD can also be defined by the to-be-controlled process chamber. Hence, each target CD can be associated with the respective control chamber, and the target CD value with which each control chamber is associated can be specified before the lot start.

Also, the source of target CD can be identified in advance. For example, there can be at least two known types of target CD, external Factory Target CD and Internal Target CD, where the Factory Target CD is the CD provided from the MES through the TL controller and the Internal Target CD is provided using input from a GUI.

In 220, the desired process result can be determined. For example, the target CD can be compared to the pre-process metrology data. When the pre-process metrology data is less than the target CD, an error can be declared. When the pre-process metrology data is approximately equal to the target CD, a "null" condition can be declared. When the pre-process metrology data is greater than the target CD, a trim amount can be established. The trim amount to be removed during a process can be regarded as the desired result if the process model which contains the relationship between trim amount and recipe parameters has been verified.

In 225, the to-be-used recipe can be determined. For example, one or more process models can be provided. A process model represents the verified relationship between the desired results (outputs) and the received variables needed to achieve those results. Process models can include table-based models.

Table-based models can comprise tables that contain the piecewise associations of desired results with recipe variables based on some evaluated experimental data. A process model can be linear or non-linear.

Figure 3:
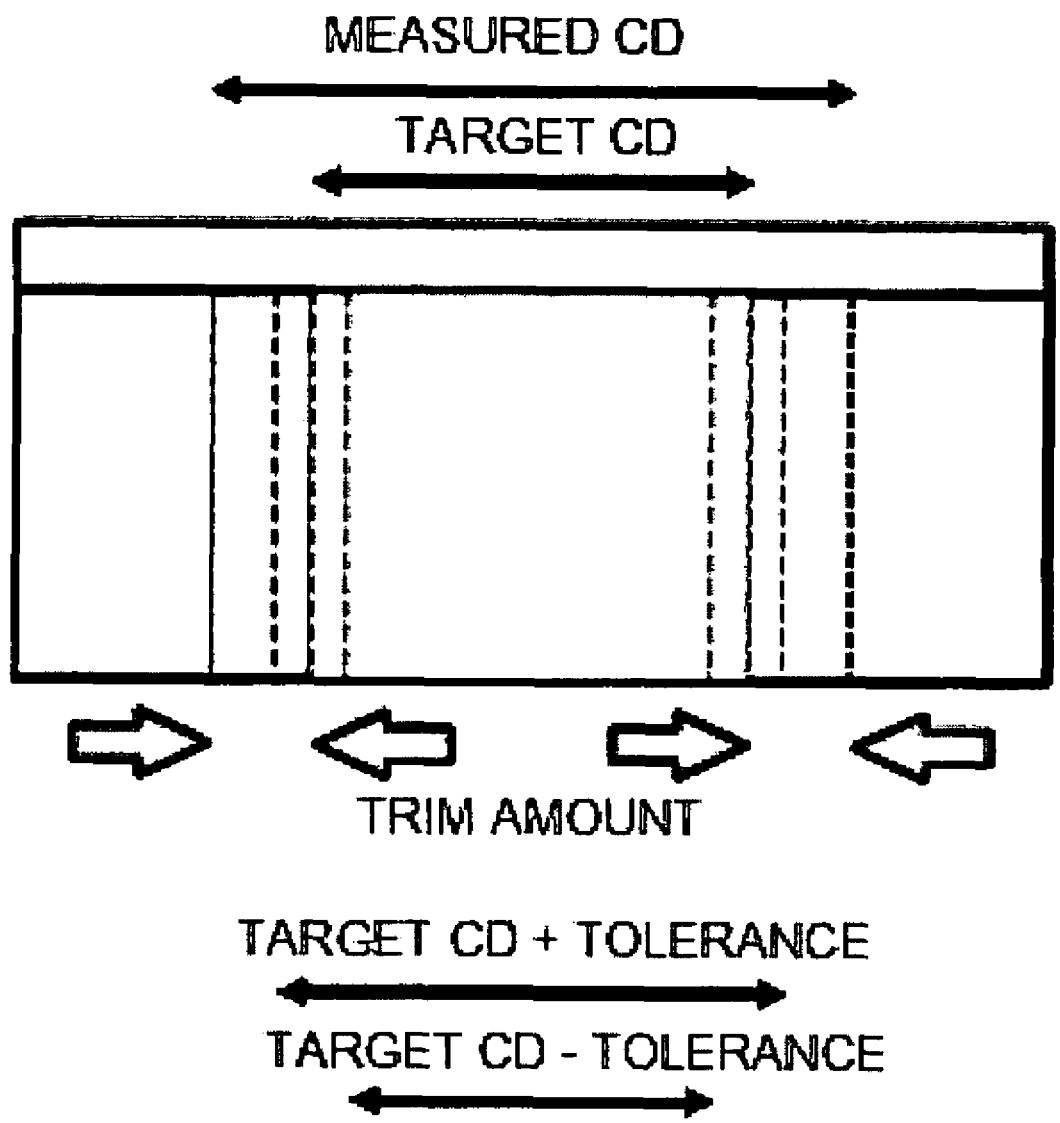
FIG. 3 illustrates an exemplary view of trimming measurements in accordance with an embodiment of the invention.

As shown in FIG. 3, the invention can be used to control the trimming etch amount for the specified control CD and to reach the target CD within tolerance. For example, the controllers (TL and R2R) can use a simple bin algorithm (a control recipe selection method) based on trim etch amount.

First of all, the control recipes containing the information on the amount to be trimmed must be evaluated and pre-qualified. Table 1 shows an example of the evaluation result. A Nominal Recipe is the base reference process recipe with the trim etch amount (TA). This example shows four control recipes (Control Recipe 1, 2, 3, 4) with respective associated trim etch amounts (TA1, TA2, TA3, TA4), but this is not required for the invention. A different number of recipes can be used and multi-dimensional recipes can be used (i.e. target CD and target depth).

Table 1 Example Control Recipe Lookup Table

| Control Recipe | Trim Amount |
| --- | --- |
| Nominal Recipe (NR) | Trim Amount (TA) |
| Control Recipe 1 (CR1) | Trim Amount 1 (TA1) |
| Control Recipe 2 (CR2) | Trim Amount 2 (TA2) |
| Control Recipe 3 (CR3) | Trim Amount 3 (TA3) |
| Control Recipe 4 (CR4) | Trim Amount 4 (TA4) |

Figure 4:
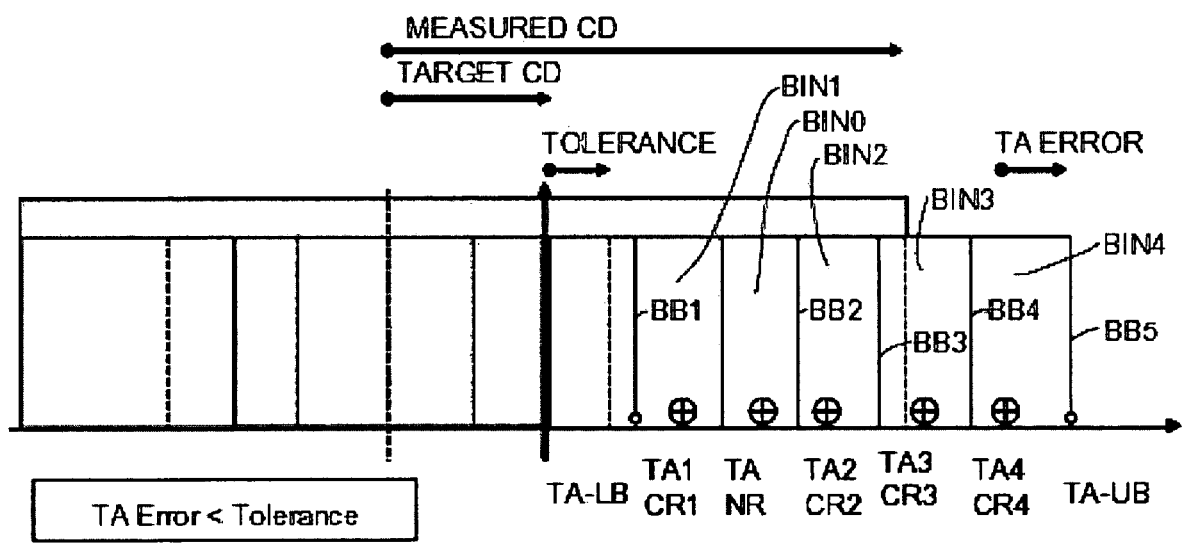
FIG. 4 illustrates an exemplary view of a recipes in accordance with an embodiment of the invention.

Based on the example recipe lookup table (Table 1), the concept chart for recipe selection is as shown on FIG. 4. Each bin represents a two-sided dimension (two times the size) in spite of only one-side shown in the chart. In addition, bin boundaries (BB1-BB5) are also shown.

In one case, the user can configure control variable settings for each control recipe; associate each control recipe with a respective trim amount; and input the trim amount upper and lower boundaries. The upper boundary can be used to establish an upper limit on the amount of trimming that can be achieved by the pre-qualified control recipes. For example, when an upper boundary is exceeded an error condition can be declared or a multi-step process can be performed. The lower boundary can be used to establish a lower limit on the amount of trimming that can be achieved by the pre-qualified control recipes. After the user confirms the configuration, the TL controller (Ingenio) divides the trim amount space between the upper and lower boundaries into several bin areas based on the trim amount inputs (TAs). The lower and upper boundary of each bin is decided by the median of the two adjacent trim amounts, and each association of the control recipe and trim amount is assigned to a bin. Alternatively, the control variable settings for the control recipe, trim amounts and trim boundaries can be downloaded from the MES.

Figure 5:
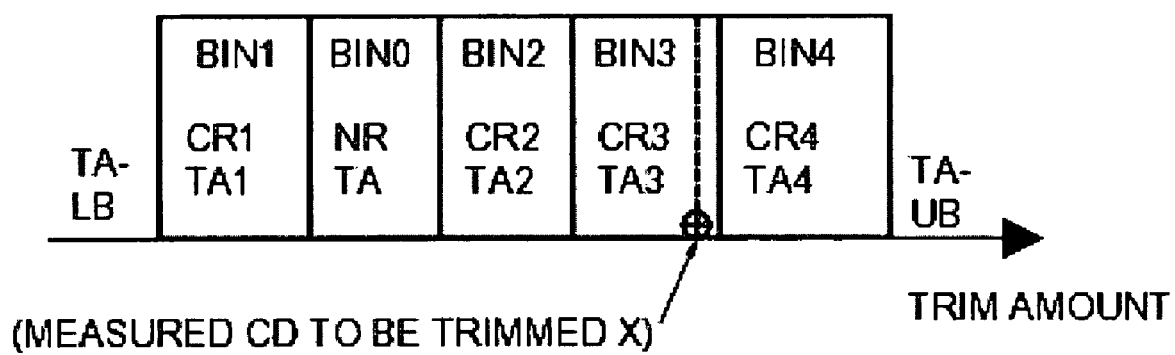
FIG. 5 illustrates an exemplary view of a simple bin algorithm in accordance with an embodiment of the invention.

Each bin has its own trim amount boundary. Once the desired CD is determined, the TL controller (Ingenio) can determine the bin in which the to-be-trimmed-amount is located. For example, the desired CD can be a measured CD, a calculated CD, and/or specified CD. This means that the closest trim amount in the control recipe is selected. The simple bin algorithm for this example is shown in FIG. 5. In this example, control recipe 3 is selected and the substrate is to be trimmed using TA3. Some differences between the to-be-trimmed amount and the selected trim amount of the control recipe, that is, trim amount error, must be configured within the target CD tolerance.

A control failure can occur, and either the TL controller (Ingenio) or the tool (Telius) can detect a control failure. Metrology data failure and recipe selection failure are the patterns of control failure that can be detected by the TL controller (Ingenio). The patterns of control failure that can be detected by the tool are recipe reception timeout, integration communication failure, and synchronization failure.

When control failure occurs (recipe reception timeout or integration communication failure), one of the following options can be used to control the TL controller (Ingenio): use the tool process recipe; bypass without processing; and stop the R2R control procedure. When control failure occurs, one of the following options can be used to control the tool (Telius) action: lot continue and lot abort.

The control plan can be regarded as an independent run-to-run control unit. In this unit, configuration settings consist of integration control with a process tool, control process, control failure action and/or control algorithm information. The independent control unit includes the control chamber(s) and the associated metrology data source indication.

In 230, the wafer is processed using the recipe determined in step 225. For example, a trimming procedure can be performed using a processing subsystem (process ship) that can comprise a COR module, a PHT module, and at least one buffer module.

First, the tool can move a wafer into a first buffer (load lock (LL)) module. The first buffer (load lock) module pumps down towards a vacuum; the tool can move the wafer to a second buffer (PHT) module; the GUI status screens are updated (showing wafer in LL). Next, the tool can move the wafer into a first process (COR) module; the TL controller (FDC component) can select a data collection (DC) strategy defined in a control strategy, and set up sensors; the status screens can be updated; module state can change; the tool performs a "Recipe Start" for the first process module; the status screens can be updated (module state can change to "wafer processing"). Then, the sensors can start recording; the recipe cycles through the processing steps; the first process module can send a "Recipe End" event; the sensors can stop recording; the tool moves the wafer to a second buffer (PHT) module. Next, the TL controller (FDC component) can collect data file(s) from the tool and start processing the data based on the data collection plan filter; the TL controller (FDC component) can select an analysis strategy defined in the control strategy; process module and process state data; and update the database (i.e. module state and process state). Then, the status screens can be updated (module state can show wafer in LL/PHT; a "Recipe Start" for the second buffer (PHT) module; the status screens can be updated (module state can change "wafer processing"). Then, the sensors can start recording; the recipe cycles through the processing steps; the second buffer (PHT) module can send a "Recipe End" event; the sensors can stop recording; the tool moves wafer to the first buffer (load lock) module; the vacuum state changes from vacuum to atmosphere; the tool moves the wafer out of the first buffer (load lock) module; and the status screens are updated.

In 235, post-process metrology data can be obtained. Post-process metrology data can be obtained after a time delay that can vary from minutes to days. Post-process metrology data can be used as a part of the feedback control. Also, the site measurement data can be summarized as the statistical value for the control wafer according to some business rules. IM data can be pre-metrology data for one control plan and post-metrology data for a different control plan. Also, the post-process metrology data can be filtered. For example, an outlier rejection filter can be used to remove data points on a wafer that are outliers and are statistically invalid. In other words, those sites that are not reliable can be thrown away and not used in the wafer mean calculation.

In one case, a Mean/Sigma compare method can be used on the post-process metrology data. For example, a sigma multiplier can be specified; all data points can be summarized into a mean and a sigma; two limits can be calculated (mean+X times sigma and mean−X times sigma); all data points outside the limits can be removed; the mean can be recalculated and can represent the final IM measurement. Alternately, outliers can be identified using a box and whisker plot methodology.

In 240, the post-process metrology data is compared with the pre-process metrology data to determine the actual process result. Post-process CD data can represent the actual process results from a process or process step. In addition, the measured trim amount during a process can be regarded as an process result.

In 245 a query is performed to determine if the process has completed. For example, the process can be completed when the target CD has been achieved. When the process has been completed, procedure 200 branches to 250 and ends. When the process has not been completed, procedure 200 branches to step 220.

An offset can be determined that is an estimated amount of process error, represents the process trend and tells the controller to optimize the process model and recipe parameters.

In one embodiment, "Control Strategies" can be used. For example, control strategies can be selected based on the system recipe. Each control strategy that matches the context can be executed. Control strategies can be evaluated on a "wafer by wafer" basis. Control strategies can contain one or more control plans. Control plans can contain the control model. When multiple control models are executed at the same time, outputs from the previous model may be used as inputs to the next model. There is at least one control plan for each process module being controlled.

A R2R controller comprises one or more control strategies. The control strategy contains the system recipe to be matched and other context matching criteria. A control strategy contains one or more control plan(s). The control plans contain the information necessary to select the control model(s) to be executed. Control plans are associated with one and only one process module. Therefore, there needs to be at least one control plan for each process module that is being controlled. For example, the control models can be table driven. All configuration information can be saved in the database.

One step in setting up the R2R is to download the system recipes from the tool. The user can request and view the set of system recipes and select one or more to download from the tool. When a system recipe is downloaded, the system recipe name, transfer route, module recipe name(s), and binary file can be saved in the database.

A configuration screen for the R2R controller can comprise a tree view showing how the control strategies, control plans, and control models are related. The user can create, import, export, edit, copy, delete, reorder, associate, and unassociate control strategies, control plans, and control models. If an object is selected and a new child type is created, the child can be associated with the parent. For example, if a control strategy is selected and a new control plan created, the control plan can be associated with the control strategy.

The tree can show the system recipe name for control strategies and module recipe name for control plans.

In one case, a number of GUI screens can be associated with a R2R controller, each with different individual functions. For example, a Run to Run Controller screen can allow users to switch to other screens; a Recipe Range screen enables users to view the tool process recipe variables by unit, select some of them as control variables, and enter the lower and upper process variable limits for the control variables; a Control Recipe screen enables the user to view the selected tool process recipe variables as to-be-controlled and enter the settings for each control variable for each recipe step; a Control Plan screen enables the configuration of the integration control information for the process tool, control process and control failure action information as well as the control algorithm information and enables a user to enter the trim etch amount associated with each control recipe for binning the simple bin table; and a Control Status screen enables users to view the selected run to run control plan and control wafer related status information.

An exemplary configuration procedure for run-to-run control of a process can be as follows: 1. Select the Recipe Range screen and configure it based on the default settings. 2. Switch to the Control Recipe screen, and configure it based on the Recipe Range configuration settings 3. Switch to the Control Plan screen and configure the Integration tab, Control tab, and Algorithm tab. 4. From the Control Plan—Algorithm tab page, switch to the Binning Table window and configure the bin table based on the Control Recipe configuration settings. 5. Switch to the Control Status screen and view the selected historical or running Control Plan status and the Control Wafer status.

Figure 6:
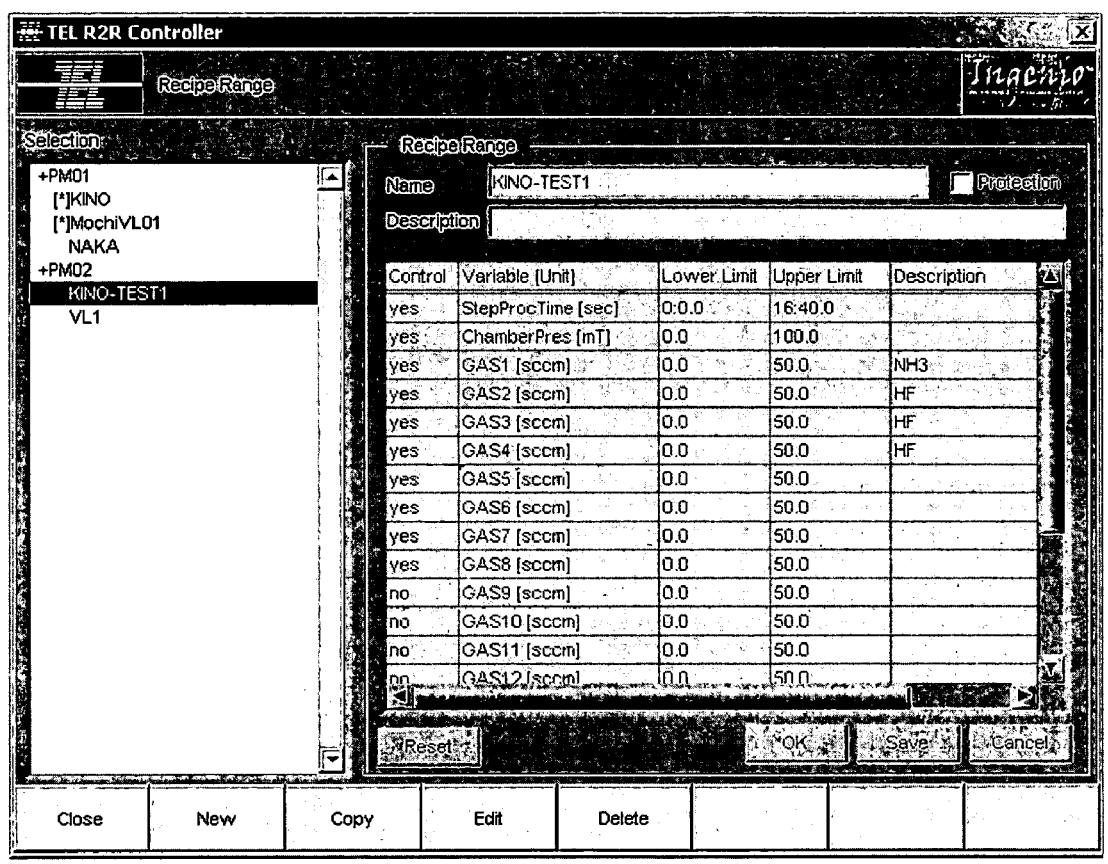
FIG. 6 illustrates an exemplary view of a Recipe Range Screen in accordance with an embodiment of the invention.

An exemplary Recipe Range Screen is shown in FIG. 6. This screen enables users to view the tool process recipe variables by unit, select control variables and input the lower and upper process limits for the control variables. The description for each variable is editable.

A Recipe Range Screen can comprise a number of configuration items. Table 2 shows an exemplary view of some of the configuration items on a Recipe Range Screen.

TABLE 2

Display Item for Recipe Range configuration

| Display Item | Description |
| --- | --- |
| Name | Recipe Range name. Users can enter the Recipe Range name after selecting the New or Copy button. After selecting the Edit button, the Recipe Range name cannot be changed. The names Null, Nominal, and Default are prohibited for Recipe Range name. |
| Description | Recipe Range description. |

The Recipe Range screen can comprise at least one checkbox, such as a Protection checkbox. Table 3 shows an exemplary view of some of the checkbox items on a Recipe Range Screen.

TABLE 3

Checkbox Description for Recipe Range configuration

| Checkbox | Description |
| --- | --- |
| Protection | The GUI only allows users to enter and save stricter limits than the tool default limits. Only protected Recipe Range is usable for Control Recipe. If you deselect the Protection options and click Save, the Protections of all the associated Control Recipes and Control Plans will be removed. The recipe range configuration cannot be edited, with the exception of the description, when Protection is enabled. |

Table 4 shows an exemplary view of some additional display items on a Recipe Range Screen.

TABLE 4

Display Table Item Description on Recipe Range screen

| Item Column | Description |
| --- | --- |
| Control | Control identifier (Yes or No). By clicking the cell, users can specify the variable as a control variable. |

TABLE 4-continued

Display Table Item Description on Recipe Range screen

| Item Column | Description |
| --- | --- |
| Variable (unit) | Tool process recipe variable with unit inside. The design format follows the process tool GUI style. This is read only. |
| Lower Limit | Lower limit of the tool process recipe variable. Enter the value by clicking the cell. |
| Upper Limit | Upper limit of the tool process recipe variable. Enter the value by clicking the cell. |
| Description | Control variable description. The default value is based on the tool process recipe variable. The variable description is used to add the control memo for the control variable. |

In addition, the Recipe Range screen can comprise a number of selection items, such as button items. Table 5 shows an exemplary view of some button items on a Recipe Range Screen.

TABLE 5

Button Description on Recipe Range configuration area

| Button | Description |
| --- | --- |
| Reset | Resets to default settings. The default settings are prepared according to process tool settings. |
| OK | Saves the Recipe Range to DB and sets the screen to View Mode. The recipe range configuration cannot be edited at this time. If a duplicate Recipe Range name is found, a message box window opens. |
| Save | Save the Recipe Range to DB. The Recipe Range information is editable. If a duplicate Recipe Range name is found, a message box window opens. |
| Cancel | Closes the Recipe Range area window without changes. |

Table 6 shows an exemplary view of some additional button items on a Recipe Range Screen.

TABLE 6

Button Description on Recipe Range Screen

| Button | Description |
| --- | --- |
| Close | Closes the Recipe Range screen and returns to the R2R Controller screen. If clicked when editing, a message box opens. |
| New | Creates a new Recipe Range associated with a process chamber. Click the chamber to associate. The Recipe Range name must be entered. |
| Copy | Click the Recipe Range name as the copy source. Click Copy to duplicate the selected Recipe Range. By default, the copied Recipe Range is not protected and the Recipe Range name is blank. |
| Edit | Users view the Recipe Range and click Edit to change the existing Recipe Range settings. Deselect the protection before editing. Once the Protection is deselected, the configuration table can be edited. |
| Delete | Click Delete to delete the existing Recipe Range. Delete all the associated Control Recipes before deleting the Recipe Range. If Protection is selected, the Delete button is not functional. |

A Recipe Range Navigator panel is shown on the left side of the Recipe Range screen, the Recipe Ranges are associated with respective process modules. By clicking on the Recipe Range name on the tree list and on any bottom function button, a user can operate the Recipe Range.

Using a Recipe Range Screen, such as shown in FIG. 6, a user can perform a Recipe Range configuration, view an existing Recipe Range, create a new Recipe Range, copy an existing Recipe Range, edit an existing Recipe Range, and delete an existing Recipe Range.

In addition, the R2R controller screens, such as the Recipe Range screen, can comprise a button for viewing software and tool version information.

Figure 7:
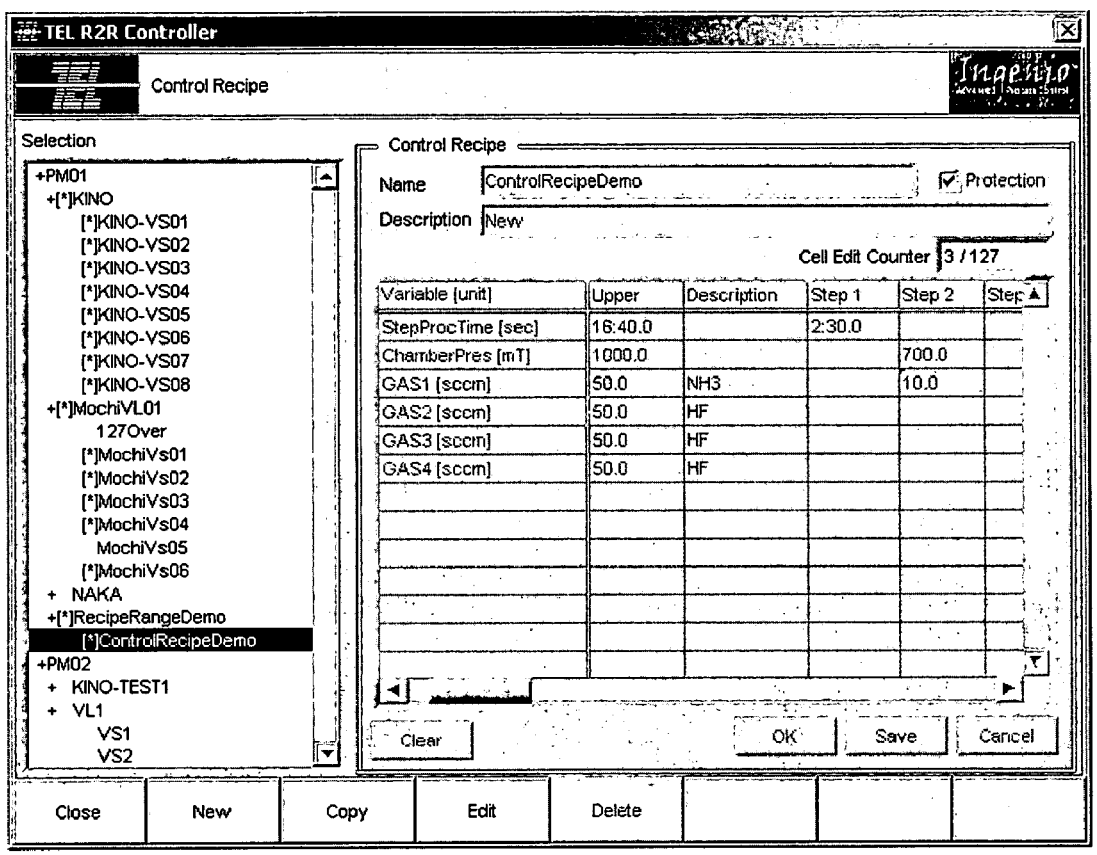
FIG. 7 illustrates an exemplary view of a Control Recipe Screen in accordance with an embodiment of the invention.

FIG. 7 illustrates an exemplary view of a Control Recipe Screen in accordance with an embodiment of the invention. This screen enables user to view the tool process recipe variables that are selected as to-be-controlled and edit the settings for each control variable for each recipe step.

A Control Recipe Screen can comprise a number of configuration items. Table 7 shows an exemplary view of some of the configuration items on a Control Recipe Screen.

TABLE 7

Display Items for Control Recipe configuration

| Display Item | Description |
| --- | --- |
| Name | Control Recipe name. Users must enter a unique Control Recipe name when clicking the New or Copy button. Users cannot change the Control Recipe name when clicking the Edit button. The names such as Null, Nominal, and Default are reserved for special use. |
| Description | Control Recipe description.. |
| Cell Edit Counter | GUI counts the number of variable step setting inputs and displays this data. This is read only. |

Table 8 shows an exemplary view of some of the display table items on a Control Recipe Screen.

TABLE 8

Display Table Items for Control Recipe configuration

| Item Column | Description |
| --- | --- |
| Variable (unit) | Control variable with unit inside. The read only display information comes from Recipe Range configuration settings. |
| Lower | Lower limit of the tool process recipe variable. The value must be entered. |
| Upper | Upper limit of the tool process recipe variable. The value must be entered. |
| Description | The control variable description comes from the Recipe Range configuration settings. This is read only. |
| Step 1–24 | Users enter the control variable settings for process recipe step 1–24. Entered cell items are counted and displayed in the count number under Cell Edit Counter. If the control variable is time, users can enter it as shown in the following format, minutes: secs. |

The Control Recipe Screen can comprise at least one checkbox, such as a Protection checkbox. Table 9 shows an exemplary view of some of the checkbox items on a Control Recipe Screen.

TABLE 9

Protection checkbox

| Checkbox | Description |
| --- | --- |
| Protection | The GUI checks if the input value for each variable is within the respective lower limit and upper limit. If they are within limits, the settings are saved. If not, the user is prompted to change the settings. Protected Control Recipe settings are used for the control plan. If Protection is deselected and the settings are saved, the Protections of all the Control Plans using the Control Recipe will be removed. The control recipe configuration can be saved only when Protection is deselected. |

In addition, the Control Recipe screen can comprise a number of selection items, such as button items. Table 10 shows an exemplary view of some button items on a Control Recipe Screen.

TABLE 10

Control Recipe Buttons

| Button | Description |
| --- | --- |
| Clear | Clears all of the step settings. A message box opens before the settings are cleared. |
| OK | Saves the Recipe Range to DB and sets the screen to View Mode. The recipe range configuration cannot be edited at this time. If a duplicate Recipe Range name is found, a message box window opens. |
| Save | Save Recipe Range to DB. The Recipe Range information can be edited. If a duplicate Recipe Range name is found, a message box window opens. |
| Cancel | Closes the Control Recipe area window without implementing the changes. |

A Control Recipe Navigator panel is shown on the left side of the Control Recipe screen, the Control Recipes are associated with respective Recipe Range. Two-layer folders are shown in a tree structure, Module and Recipe Range. By clicking on the Control Recipe name on the tree list and on any bottom function button, a user can operate the Control Recipe. By clicking on the Recipe Range name on the tree list and on any bottom function button, a user can operate the Recipe Range.

Using a Control Recipe Screen, such as shown in FIG. 7, a user can perform a Control Recipe configuration, view an existing Control Recipe, create a new Control Recipe, copy an existing Control Recipe, edit an existing Control Recipe, and delete an existing Control Recipe.

Figure 8:
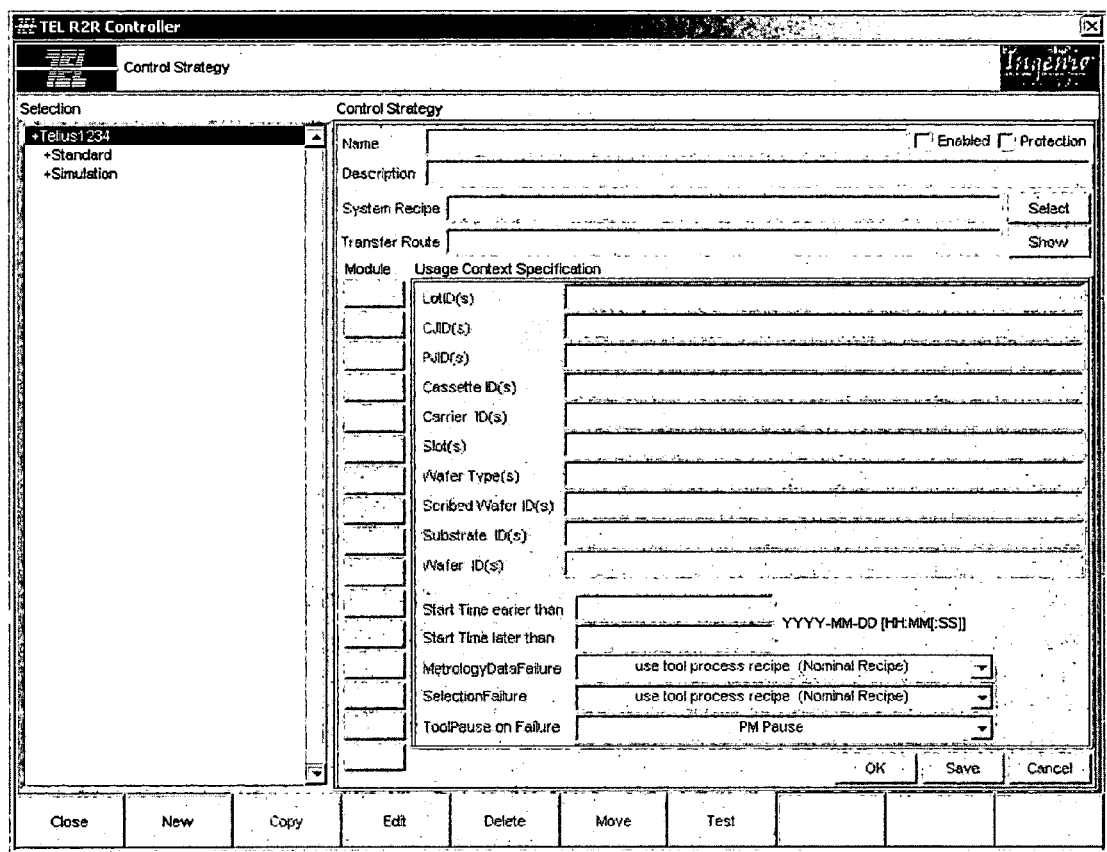
FIG. 8 illustrates an exemplary view of a Control Strategy Screen in accordance with an embodiment of the invention.

FIG. 8 illustrates an exemplary view of a Control Strategy Screen in accordance with an embodiment of the invention. The control strategy contains the system recipe to be matched and other context matching criteria. The control strategy also contains several independent control plans that contain the information necessary to select the control model(s) to be executed. A Control Strategy screen enables users to download system recipe with control chamber flags or manually input the system recipe name with transfer route. Also, users can optionally create some context matching criteria.

A Control Strategy Screen can comprise a number of configuration items. Table 11 shows an exemplary view of some of the configuration items on a Control Strategy Screen.

TABLE 11

Control Strategy Screen Features

| Feature | Description |
| --- | --- |
| Name | Control Strategy name |
| Description | Control Strategy Description |
| Enabled | Enable the Control Strategy |
| Protection | Protect the Control Strategy |
| System Recipe | Click the Select button to download the system recipe from Telius and display it. The system recipe name can be directly. The system recipe name is used to trigger the control strategy by matching the context system recipe name. |
| Select | Opens the Load Port selection and then system recipe download window. |
| Transfer Route | Displays the system recipe route according to the selected system recipe. |
| Show | Shows the transfer route of system recipe on the Module node graph. |
| Module | When the chamber button is clicked, the chamber graph color will change to pink displaying the control chamber |
| Metrology Data Failure | Selects one out of the options, Use Tool Recipe, Do Not Process Wafer or Follow Tool Parameter Setting. Refer to Action on Metrology Data Failure |
| Selection Failure | Select one out of the options: Use Tool Recipe, Do Not Process Wafer or Follow Tool Parameter Setting. |
| Tool Pause on Failure | Select PM Pause or System Pause |
| Wafer Contexts | Displays Wafer Contexts. |

A Control Strategy Screen can comprise a number of additional configuration items. Table 12 shows an exemplary view of some of the additional configuration items on a Control Strategy Screen.

TABLE 12

Control Strategy Screen Additional Features

| Contxt | Description |
| --- | --- |
| LotID(s) | Lot identifiers |
| CJID(s) | Control job identifiers |
| PJID(s) | Process job identifiers |
| Cassette ID(s) | Cassette identifiers |
| Carrier ID(s) | Carrier identifiers |
| Slot(s) | Slot numbers |
| Wafer Type(s) | |
| Scribed Wafer ID(s) | |
| Substrate ID(s) | |
| Wafer ID(s) | |
| Start Time | |
| Start Time | |

In addition, the Control Strategy screen can comprise a number of selection items, such as button items. Table 13 shows an exemplary view of some button items on a Control Strategy Screen.

TABLE 13

Control Strategy Buttons

| Button | Description |
| --- | --- |
| OK | Saves the Control Recipe to the database and sets the screen to View Mode. The Control Strategy configuration cannot be edited at this time. If a duplicate Control Strategy name is found, a message box window opens. |
| Save | Saves the Control Strategy to the database. The Control Strategy information is editable. If a duplicate Control Strategy name is found, a message box window opens. |
| Cancel | Closes the Control Strategy area window without changes. |

Also, the Control Strategy screen can comprise a number of additional selection items, such as button items. Table 14 shows an exemplary view of some additional button items on a Control Strategy Screen.

TABLE 14

Additional Control Strategy Buttons

| Button | Description |
| --- | --- |
| Close | Closes the Control Strategy screen and returns to the Run to Run Controller screen |

TABLE 14-continued

Additional Control Strategy Buttons

| Button | Description |
|---|---|
| New | Creates a new control strategy. Enter the control strategy name and configuration |
| Copy | Select the Control Strategy and click Copy. By default, the copied control strategy is not protected and the Control Strategy name is blank. |
| Edit | Users view the control strategy and click "Edit" to edit the existing control strategy configuration. Deselect Protection before editing. Once the Protection is off, the configuration is editable. |
| Delete | Users view the control strategy and click Delete to delete an existing control strategy. If the control strategy is Protected, the Delete button is not functional. |
| Move | Users view the control strategy and click Move to move to the user specified target folder and position. Standard control strategies can be moved to the simulation folder. Simulation control strategies cannot be moved to the standard folder if they lack system recipe synchronization information with the process tool. |
| Test | Test configuration button. Click to select some historical metrology data to test the control strategy configuration. It is only functional when the R2R controller in not connected to the tool. |

A Control Strategy Navigator panel is shown on the left side of the Control Strategy screen, there are two types of folders: Standard and Simulation. The Standard type folder contains the standard control strategies (configured as normal run to run integrated control) with the process tool. The Simulation type folder contains the simulation control strategies. Each simulation control strategy is associated with some simulation control plan(s). Based on the model selected, the control plan will tune the recipe variables. The recipe variables will be logged on Ingenio but will not be sent to the process tool. Multiple simulation control strategies can be executed simultaneously but only one standard type of control plan will be executed for a given wafer. A standard control strategy can be moved from the standard folder to the simulation folder. A simulation control strategy can be moved to a standard folder as if the corresponding system recipe is downloaded from the tool. Protected control strategies have a star mark beside the control strategy name. Only the protected control strategies can be executed.

Using a Control Strategy Screen, such as shown in FIG. 8, a user can perform a Control Strategy configuration, view an existing Control Strategy, create a new Control Strategy, copy an existing Control Strategy, edit an existing Control Strategy, and delete an existing Control Strategy.

Figure 9A:
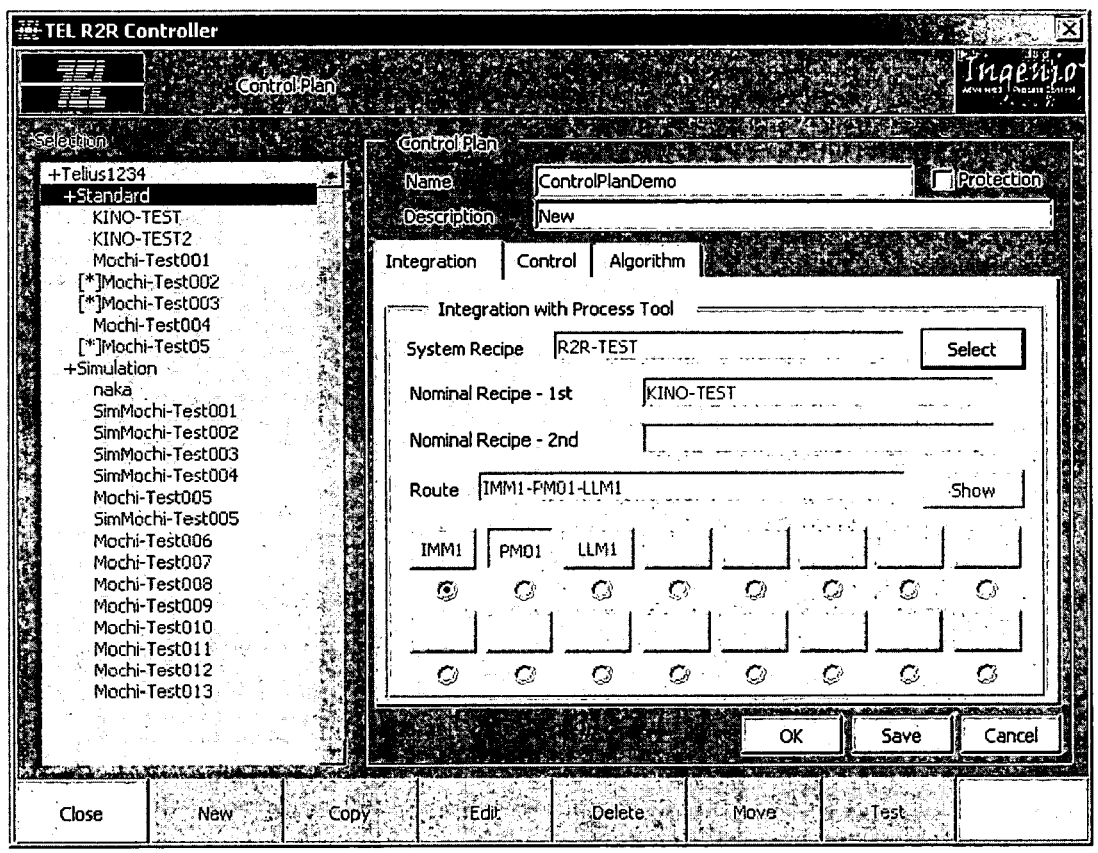
FIGS. 9A-9C illustrate exemplary views of Control Plan Screens in accordance with an embodiment of the invention.
Figure 9B:
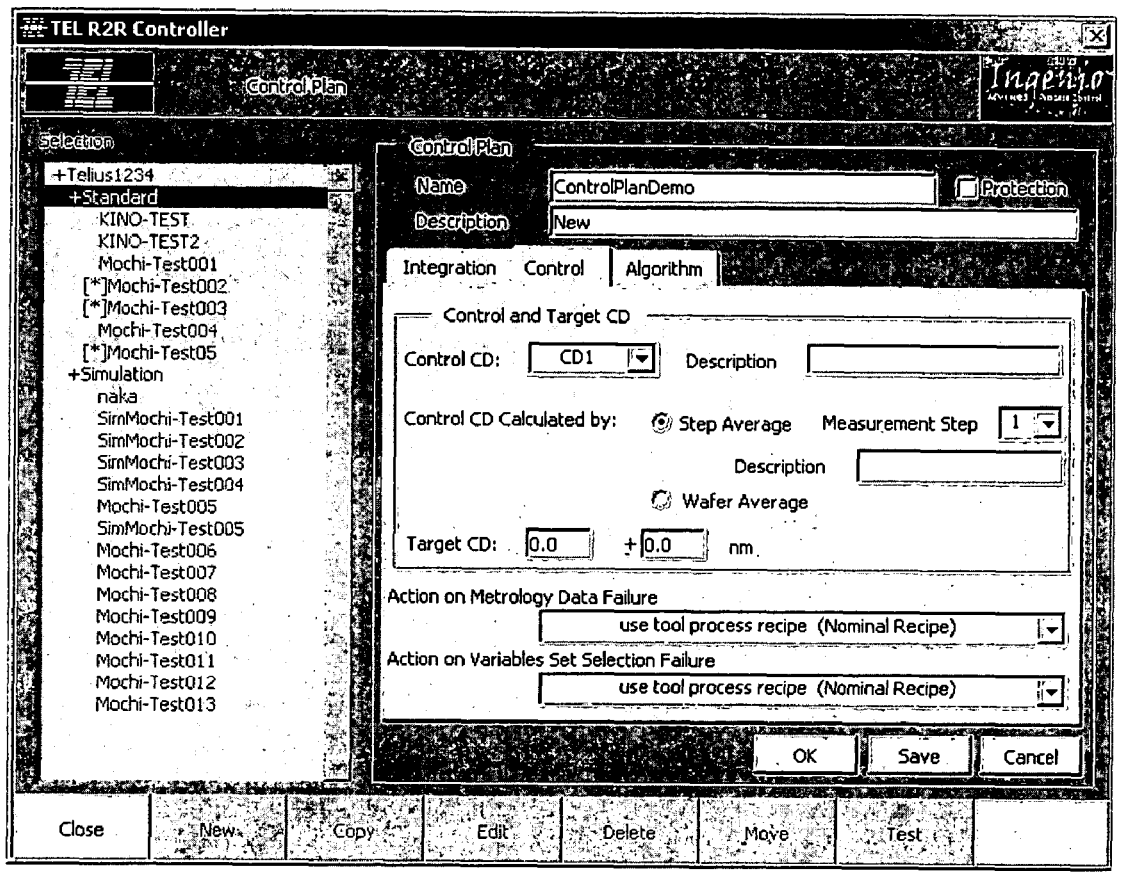
Figure 9C:
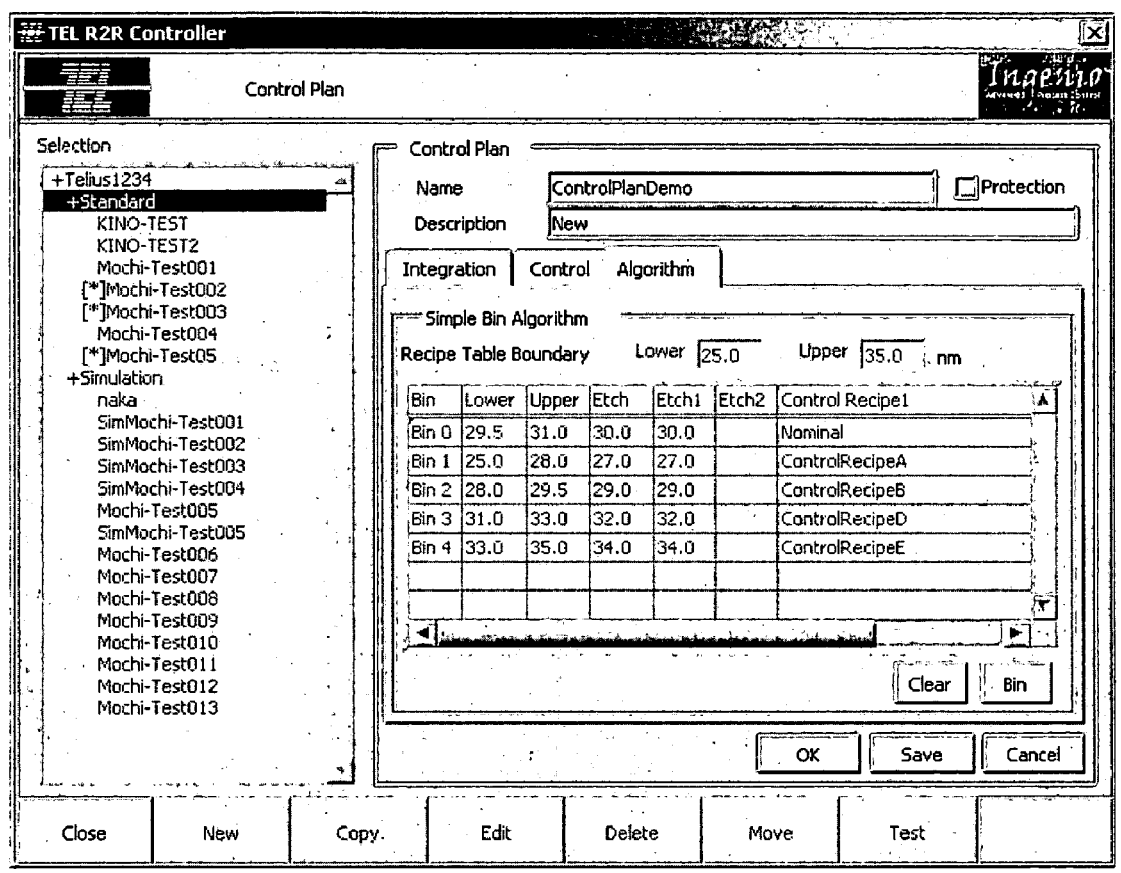

FIGS. 9A-9C illustrate exemplary views of Control Plan Screens in accordance with an embodiment of the invention. These screens enable users to configure the integration control information for the process tool, enter the control process and control failure action information as well as control algorithm information and in the Simple Bin table, a user can enter the trim etch amount associated with each control recipe for binning.

In FIG. 9A, an Integration Tab page is shown in accordance with an embodiment of the invention.

A Control Plan Screen can comprise a number of configuration items. Table 15 shows an exemplary view of some of the configuration items on a Control Plan Screen.

TABLE 15

Control Plan Screen Features

| Feature | Description |
|---|---|
| Name | Control plan name. |
| Description | Control plan description. |
| Protection | When Protection is selected and OK or Save is clicked, the software logic checks the configuration. If the configuration fails, a message box window opens, stating the cause of the failure. Since only one standard control plan can be triggered by context matching with system recipe at a time, the software logic only executes the control plan located at the top of the list. The configuration can be edited when Protection is deselected. |
| System Recipe Module Nominal Recipe Data checkbox | |
| Target | Users enter the target CD value with the tolerance. The input target CD with the measured initial control CD average is used to calculate the trim etch amount for the control recipe selection. If Protection is selected, the input target CD tolerance is compared with all the trim etch amounts entered on an Algorithm information tab. |
| Target Calculation t = f(d,o) Source # Model Selection Table | |

Table 16 shows an exemplary view of some additional button items on a Control Plan Screen.

TABLE 16

Control Plan Screen Additional Buttons

| Button | Description |
|---|---|
| Close | Closes the Control Plan screen and returns to the Run to Run Controller screen |
| New | Creates a new control plan. Enter the control plan name and the integration information to go with the process tool, control CD information with the control error action, and algorithm information for mapping the etch amount to each control recipe before it can be protected and saved. |
| Copy | Select the control plan and click Copy. By default, the copied control plan is not protected and the control plan name is blank. |
| Edit | Users view the control plan and click "Edit" to edit the existing control plan configuration. Deselect Protection before editing. Once the Protection is off, the configuration is editable. |
| Delete | Users view the control plan and click Delete to delete an existing control plan. If Protection off, the Delete button is not functional. |
| Move | Users view the control plan and click Move to move to the user specified target folder and position. Standard control plans can be moved to the simulation folder. Simulation control plans cannot be moved to the standard folder if they lack system recipe synchronization information with the process tool. |
| Test | Test configuration button. Click to select some historical metrology data to test the control plan configuration. It is only functional in a disconnected state. |

A navigation tree is shown that includes two types of folders: Standard and Simulation. The Standard type folder contains the standard control plans (configured as normal run to run integrated control) with the process tool. The Simulation type folder contains the simulation control plans. For simulation control strategies, it does not matter if the R2R control setting on the process tool is enabled. The controller (TL and/or R2R) receives and processes metrology data and selects the control model. The selected or calculated control recipe is logged but not sent to the process tool. Multiple control plans can be triggered simultaneously.

The control plan display items can include a Name field for the control plan name; a Description field for the control plan description; and a Protection box. The configuration can be edited when Protection is deselected.

In the center of the control plan configuration screen, there are three tabs: Integration tab, Control tab and Algorithm tab.

A number of buttons are also shown including: an OK button, a Save button, a Cancel button, a Close button, a New button, a Copy button, an Edit button, and a Delete button for creating, deleting, viewing, and editing Control Recipe items.

System Recipe Name field and the associated Select button provides a means for downloading system recipes from a tool (Telius) and displaying them. Also, a user can enter system recipe names directly. The system recipe name is used to trigger the control plan by matching the context system recipe name. Furthermore, the Select button opens the Load Port Selection window, and from this window, a user can select the load port and then select from the list of available system recipes.

The Nominal Recipe—$1^{st}$ field displays the process recipe name of the R2R control chamber's first visit information that is included in the selected system recipe. The Nominal Recipe—$2^{nd}$ field displays the process recipe name of the R2R control chamber's second visit information that is included in the selected system recipe. The Route field displays the system recipe route according to the selected system recipe. The Chamber sequence buttons show the control chambers.

If the R2R control setting information is included in the system recipe from the tool, the control plan will be associated with a standard folder. If the information is not included, the control plan will be associated with the simulation folder and user must specify the control chamber by selecting the chamber in the chamber sequence node graph.

In FIG. 9B, a Control Tab page is shown in accordance with an embodiment of the invention. For example, there can be three parts in the control tab page: Control and Target CD, Action on Metrology Data Failure, and Action on Recipe Selection Failure.

The Control Tab page can comprise a Control CD field that can be controlled using a CD list box. For example, a user can select the control CD from the list with a reference to Timbre ODP configuration, and can enter the description for the selected Control CD.

There are two radio buttons for choosing the Control CD calculation method either Step Average or Wafer Average. The Measurement Step field shows the IM Measurement Step. If the Step Average radio button is selected, users must specify the IM measurement step. If the Wafer Average radio button is selected, the measurement step with the description will be disabled and in "grayed out" mode. After a user selects the measurement step, the user can enter the description for the measurement step.

Target CD fields provide a means for a user to enter the target CD value with the tolerance. The input target CD with the measured initial control CD average is used to calculate the trim etch amount for the control recipe selection. If Protection is selected, the input target CD tolerance is compared with all the trim amounts entered on the Algorithm Tab.

If metrology data failure occurs or variable set selection failure occurs, users can choose from one of the following options: 1) Use tool process recipe (Nominal Recipe). Software logic sends the indication to the process tool and the process tool uses the tool process recipe. 2) Do not process wafer (Null Recipe). Software logic sends the null recipe information associated with the wafer to the process tool and the wafer goes in and out of the chamber without being processed. 3) Stop run-to-run control (None).

In FIG. 9C, an Algorithm Tab page is shown in accordance with an embodiment of the invention. For example, a simple bin algorithm can be a control recipe selection method that is based on trim etch amount. If the selected control recipe settings are the same as the process recipe on the process tool, the control variable's name is "Nominal" by default which can result in the use of the same tool process recipe which will trim the etch amount associated with it.

There are two buttons on the algorithm tab page. The Bin button is used to open the Binning Table window (FIG. 10) for configuration of the association of the control recipe and trim amount, and the Clear button can be used to clear Bin Table Settings.

The Binning Table window can have three parts. The Bin Table Boundary input allows users to enter the bin table boundary. The Recipe Range filter allows users to view all the protected control recipes associated with the selected recipe range. Users must click the Control Recipe 1 and Control Recipe 2 cell to open the Control Recipe Selection window. After selecting from the list for both visits, the trim etch amount can be entered for each displayed control recipe. The software logic calculates the total etch amount for both visits.

The Control Recipe Viewer is at the bottom of the screen. The Control Recipe Viewer allows users to view the control recipe information and description. The description for the control recipe is displayed based on the information entered from the Control Recipe screen. When a user selects the cell of Control Recipe 1 or Control Recipe 2, the Control Recipe Selection window opens and allows users to select the control recipe. By default, the name "Nominal" and "Null" appears the first two cells. Here, Null means non-processing for this selected visit. If a new control recipe is added on the Control Recipe screen with the associated Recipe Range, users can click the control recipe cell to open the Control Recipe Selection window. Users then select the new control recipe in the Control Recipe Selection window.

Once the Binning Table configuration is finished, software logic gives the Bin name, sequentially by default, and calculates each Bin boundary according to the number of trim etch amount inputs and the trim etch amount boundaries of the Bin table. Finally, the Bin table lower and upper boundary displays on the Algorithm tab page, and the following items are listed in the bin table. The Bin field shows the bin name; the Lower field shows the bin lower boundary; Upper field shows the bin upper boundary; the Etch field shows the total trim etch amount; the Etch 1 field shows the first visit trim etch amount; the Etch 2 field shows the second visit trim etch amount; the Control Recipe 1 field shows the first visit control recipe name; and the Control Recipe 2 field shows the second visit control recipe name.

Figure 11:
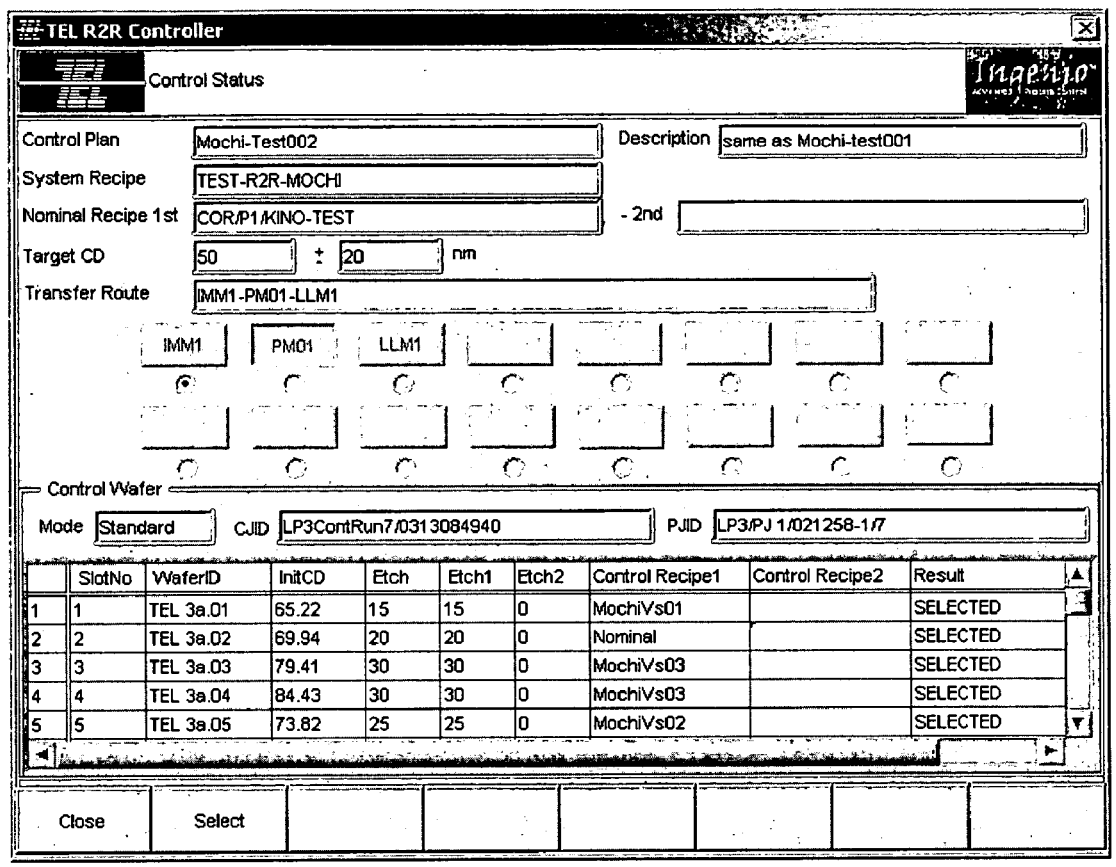
FIG. 11 illustrates an exemplary view of a Control Status screen in accordance with an embodiment of the invention.

In FIG. 11, an exemplary view of a Control Status screen is shown in accordance with an embodiment of the invention. This screen enables users to view the selected R2R control plan and control wafer status information.

A Control Status screen can comprise a number of configuration items. Table 17 shows an exemplary view of some of the configuration items on a Control Status screen.

TABLE 17

Control Status Screen Features

| Display Item | Description |
| --- | --- |
| Control Plan Name | Control plan name |
| Description | Control plan description |
| System Recipe | System recipe name |
| Nominal Recipe-1st | Control base reference process recipe for the first visit to the chamber |
| Nominal Recipe-2nd | Control base reference process recipe for the second visit to the chamber |
| Target CD with tolerance | Target CD value with tolerance configured on the control plan. The units are nanometers. |
| Transfer Route | System recipe route |
| Chamber sequence node graph | Distinguishable for the used metrology data and control chamber |

A Control Status screen can comprise a number of additional configuration items. Table 18 shows an exemplary view of some of the additional configuration items on a Control Status screen.

TABLE 18

Additional Control Status Screen Features

| Display item | Description |
| --- | --- |
| Mode | Run mode. Standard or Simulation or Test. |
| CJID | Control Job ID |
| PJID | Process Job ID |
| Slot ID | FOUP Slot ID |
| Wafer ID | The wafer identifier displays following the display priority. If there is a scribed wafer id, it displays. If not, the substrate wafer id from the host displays. |
| Init. CD | The initial CD of the Site control CD measurement average |
| Etch | The total etch amount configured in the control plan. |
| Etch 1 | The etch amount of the first control visit or chamber configured in the control plan. |
| Etch 2 | The etch amount of the second control visit or chamber configured in the control plan. |
| Control Recipe 1 | Control variables set the name for the first control visit or chamber. |
| Control Recipe 2 | Control variables set the name for the second control visit or chamber |
| Result | The result for the control wafer. There can be four values. Selected-Control Recipe Selected Successfully. Select Error-Control Recipe Selection Failure Link Error-Telius-Ingenio Communication Failure Data Error-Metrology Data Error |

In addition, the Control Status screen can comprise a number of selection items, such as button items. Table 19 shows an exemplary view of some button items on a Control Status Screen.

TABLE 19

Control Status Screen Buttons

| Button | Description |
| --- | --- |
| Close | Switches from the Control Status screen to the Run to Run Controller screen. |
| Select | Opens the Control Status Display Selection window |

Figure 12:
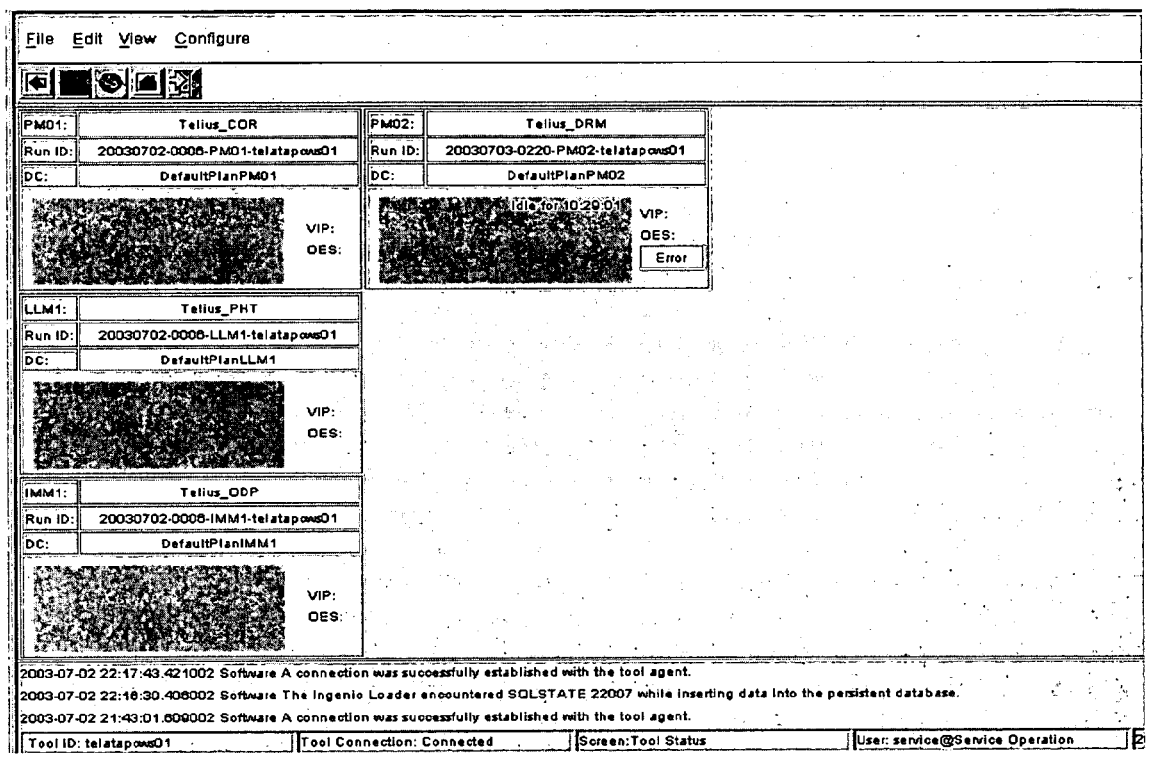
FIG. 12 illustrates an exemplary view of a status screen in accordance with an embodiment of the invention.

In FIG. 12 a status screen is shown in accordance with an embodiment of the invention. In the illustrated embodiment, a COR module, a PHT module, and an ODP module are shown in one group.

Sub panels can be used to display data for each process module. Information about the wafer currently in a process module can be displayed in the PM, Run ID, and Plan fields. For example, PM can be the process module name; Run ID can be the ID of the recipe for the current wafer; and Plan can be the name of the data collection plan executed on the current wafer.

A user can view a status screen such as shown in FIG. 12 to ensure that a COR module, a PHT module, and/or an ODP module are using the correct data collection plan. For example, a user can verify that the proper metrology data is being collected.

Figure 13:
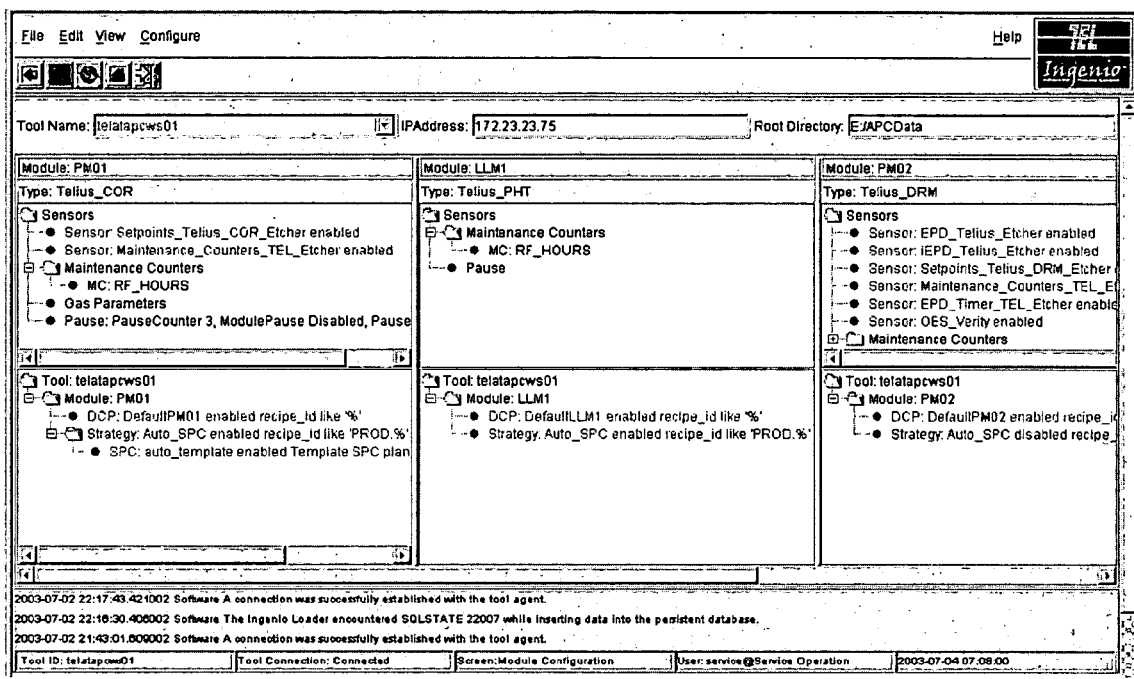
FIG. 13 illustrates an exemplary view of a module configuration screen in accordance with an embodiment of the invention.

In FIG. 13 a configuration screen is shown in accordance with an embodiment of the invention. In the illustrated embodiment, a COR module, a PHT module, and an ODP module are shown. The navigation tree shows the sensors and maintenance counters associated with each module. In addition, the data collection plans and the strategies associated with each module are also shown. Also, the module pause configuration is shown for each module. A user can configure the pause actions using analysis plans and strategies.

The COR, PHT, and ODP chambers can be configured during the installation of system, and chamber configurations can be changed using GUI screens accessible from the configuration screen. For example, drop-down lists can be used.

Figure 14:
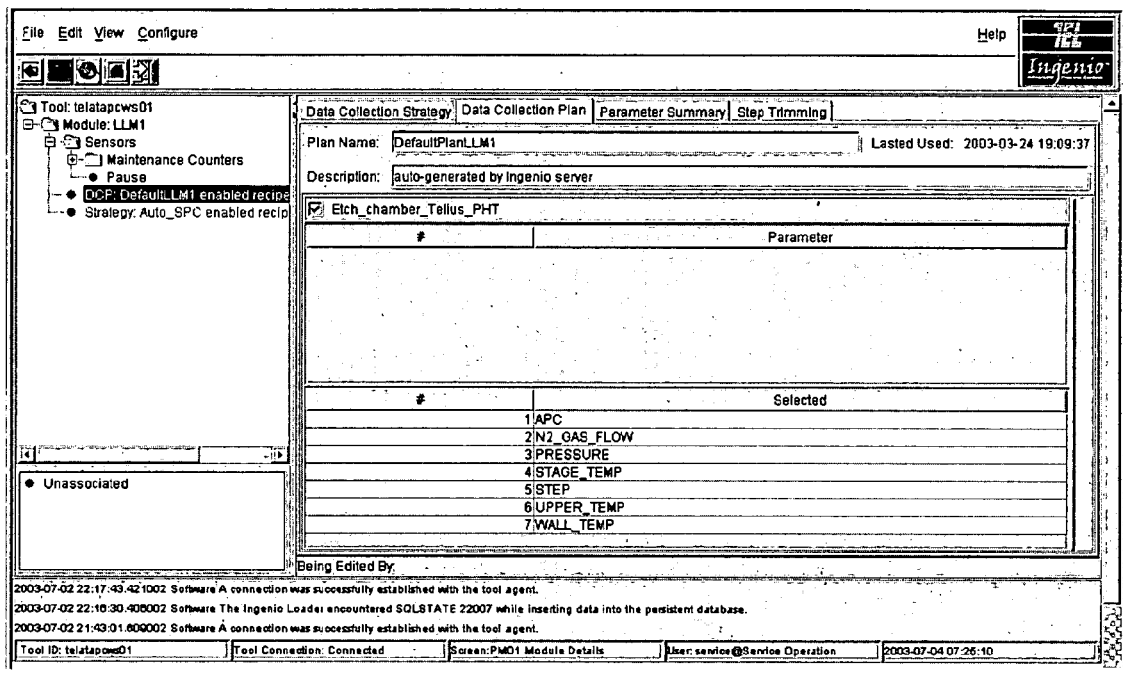
FIG. 14 illustrates an exemplary view of a data collection plan configuration screen in accordance with an embodiment of the invention.

In FIG. 14 a configuration screen is shown in accordance with an embodiment of the invention. In the illustrated embodiment, a COR module, a PHT module, and an ODP module are shown. The navigation tree shows the sensors and maintenance counters associated with each module. In addition, the data collection plans and the strategies associated with each module are also shown. Also, the module pause configuration is shown for each module. A user can configure the pause actions using analysis plans and strategies.

The context matching for run-to-run control plans can contain all of the options that are available for data collection plans and analysis strategies.

A GUI can be provided to set the control plan context matching. Control plan context definition can be allowed for users with greater than normal security level.

A control plan is generally related to a process module and process recipe combination. Since the tool allows multiple system recipes to include the same process recipe, R2R can allow multiple control strategies to share a control plan.

There may be different process module recipe limits for different process module recipes. So each control plan needs to be able to set the recipe constraints to be used for the recipe modifications to be sent to the tool by the R2R controller.

The control plan can specify the minimum and maximum range that a control model is to be used. Control module ranges may overlap. If no minimum and/or maximum range is entered, then the missing range is unlimited.

One method for using a R2R controller requires the creation of a control strategy that is linked to a tool (Telius) recipe when a system recipe has been created on the tool. The user can enter the data collection plan, and analysis plan for each module. The user can enter a control plan (which chamber data to use, analysis algorithm) that the specified chamber is to be controlled.

Module type of COR, PHT, ODP, and buffer chambers can be stored in the database. Therefore, a user can configure the Module Instances for COR, PHT, ODP, and buffer chambers after installation. For example, Module Instance Configuration screens that are part of the system can be used. In addition, strategies and plans can be created for COR, PHT, ODP, and buffer chambers using Data Manager screens. For example, a user can create Data Collection Strategy and Analysis Strategy for COR, PHT, ODP, and buffer chambers, when these Module Instances are set on Module Instance screen. Chart screens are also available for the COR, PHT, ODP, and buffer chambers.

The data management system collects trace log files and process log files that are made on COR and PHT chambers. The trace log data that are selected on the DC plan will be stored in database; the user can use data that are selected on the DC plan for the analysis plan; the user can use data that are selected on the DC plan for charting. In addition, GUI screens can be used to display the necessary information about COR and PHT process at run-time. A user can use module pause feature to pause a COR and/or PHT chamber if it is set.

The TL controller can perform a module pause when it detects the SPC alarm for a COR chamber parameter or when it detects the SPC alarm for a PHT chamber parameter. The module pause can be configured using the analysis strategy and analysis plan for the respective chambers.

Figure 15:
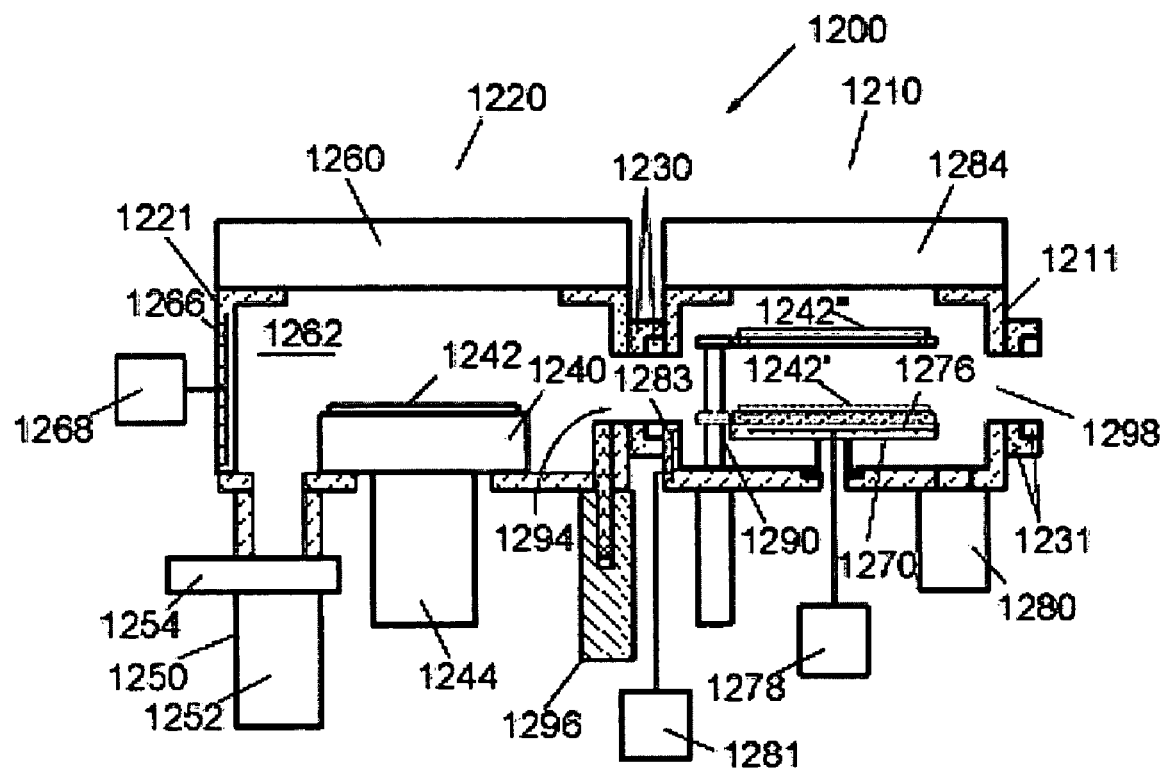
FIG. 15 shows a schematic cross-sectional view of a processing system according to an embodiment of the present invention.

FIG. 15 shows a schematic cross-sectional view of a processing system according to an embodiment of the present invention. In the illustrated embodiment, a processing system 1200 for performing chemical treatment and thermal treatment of a substrate is presented. Processing system 1200 comprises a thermal treatment system 1210, and a chemical treatment system 1220 coupled to the thermal treatment system 1210. The thermal treatment system 1210 comprises a thermal treatment chamber 1211, which can be temperature-controlled. The chemical treatment system 1220 comprises a chemical treatment chamber 1221, which can be temperature-controlled. The thermal treatment chamber 1211 and the chemical treatment chamber 1221 can be thermally insulated from one another using a thermal insulation assembly 1230, and vacuum isolated from one another using a gate valve assembly 1296, to be described in greater detail below.

Figure 16:
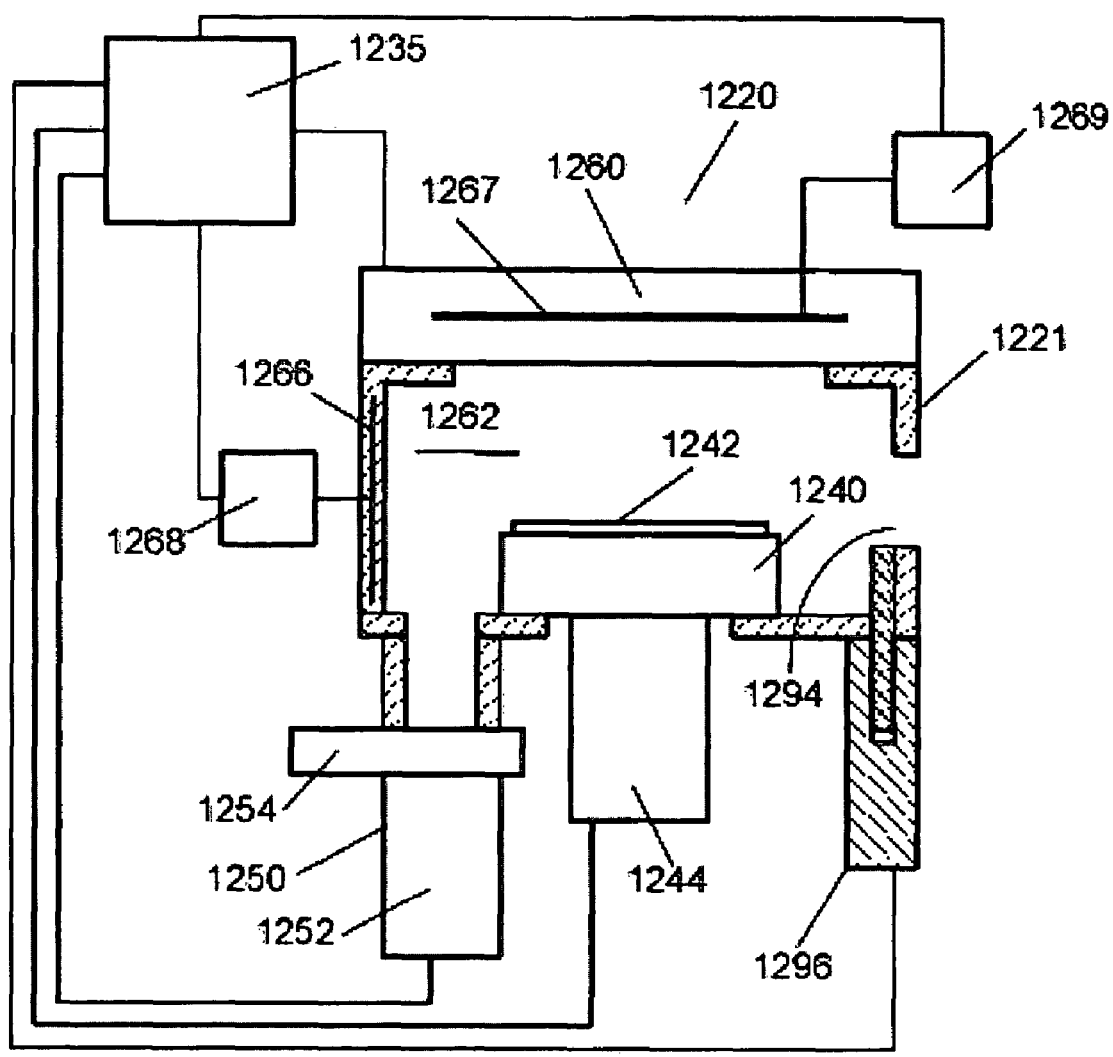
FIG. 16 shows a schematic cross-sectional view of a chemical treatment system according to an embodiment of the present invention.

As illustrated in FIGS. 15 and 16, the chemical treatment system 1220 further comprises a temperature controlled substrate holder 1240 configured to be substantially thermally isolated from the chemical treatment chamber 1221 and configured to support a substrate 1242, a vacuum pumping system 1250 coupled to the chemical treatment chamber 1221 to evacuate the chemical treatment chamber 1221, and a gas distribution system 1260 for introducing a process gas into a process space 1262 within the chemical treatment chamber 1221.

Figure 17:
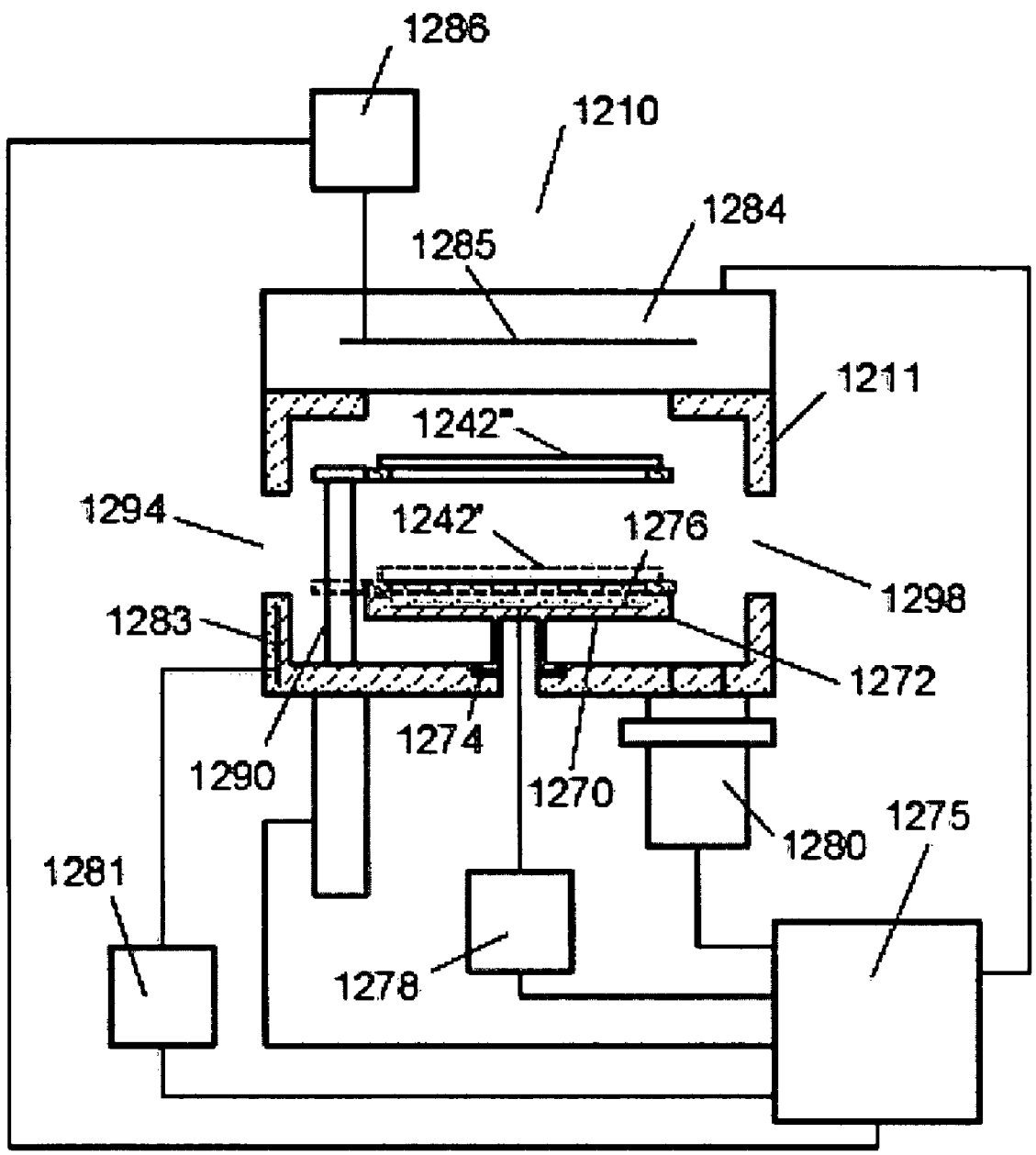
FIG. 17 shows a schematic cross-sectional view of a thermal treatment system according to an embodiment of the present invention.

As illustrated in FIGS. 15 and 17, the thermal treatment system 1210 further comprises a temperature controlled substrate holder 1270 mounted within the thermal treatment chamber 1211 and configured to be substantially thermally insulated from the thermal treatment chamber 1211 and configured to support a substrate 1242', a vacuum pumping system 1280 to evacuate the thermal treatment chamber 1211, and a substrate lifter assembly 1290 coupled to the thermal treatment chamber 1211. Lifter assembly 1290 can vertically translate the substrate 1242" between a holding plane (solid lines) and the substrate holder 1270 (dashed lines), or a transfer plane located therebetween. The thermal treatment chamber 1211 can further comprise an upper assembly 1284.

Additionally, the thermal treatment chamber 1211, chemical treatment chamber 1221, and thermal insulation assembly 1230 define a common opening 1294 through which a substrate can be transferred. During processing, the common opening 1294 can be sealed closed using a gate valve assembly 1296 in order to permit independent processing in the two chambers 1211, 1221. Furthermore, a transfer opening 1298 can be formed in the thermal treatment chamber 1211 in order to permit substrate exchanges with a transfer system. For example, a second thermal insulation assembly 1231 can be implemented to thermally insulate the thermal treatment chamber 1221 from a transfer system (not shown). Although the opening 1298 is illustrated as part of the thermal treatment chamber 1211, the transfer opening 1298 can be formed in the chemical treatment chamber 1221 and not the thermal treatment chamber 1211, or the transfer opening 1298 can be formed in both the chemical treatment chamber 1221 and the thermal treatment chamber 1211.

As illustrated in FIGS. 15 and 16, the chemical treatment system 1220 comprises a substrate holder 1240, and a substrate holder assembly 1244 that enables thermal control and processing of substrate 1242. The substrate holder 1240 and substrate holder assembly 1244 can comprise an electrostatic clamping system (or mechanical clamping system) in order to electrically (or mechanically) clamp substrate 1242 to the substrate holder 1240. Furthermore, substrate holder 1240 can, for example, further include a multi-zone temperature control system that can receive heat and transfer heat to a heat exchanger system (not shown), or when heating, can transfer heat from the heat exchanger system. Moreover, a heat transfer gas can, for example, be delivered to the back-side of substrate 1242 via a backside gas system to improve the gas-gap thermal conductance between substrate 1242 and substrate holder 1240. For instance, the heat transfer gas supplied to the back-side of substrate 1242 can comprise an inert gas such as helium, argon, xenon, krypton, a process gas such as $CF_4$, $C_4F_8$, $C_5F_8$, $C_4F_6$, etc., or other gas such as oxygen, nitrogen, or hydrogen. Such a system can be utilized when temperature control of the substrate is required at elevated or reduced temperatures. For example, the backside gas system can comprise a multi-zone gas distribution system such as a two-zone (center-edge) system, wherein the backside gas gap pressure can be independently varied between the center and the edge of substrate 1242. In other embodiments, the multi-zone temperature control system can comprise heating/cooling elements, such as resistive heating elements, or thermoelectric heaters/coolers. An exemplary thermoelectric element is one commercially available from Advanced Thermoelectric, Model ST-127-1.4-8.5M (a 40 mm by 40 mm by 3.4 mm thermo-electric device capable of a maximum heat transfer power of 72 W). Also additional heating/cooling elements can be located in the chamber wall of the chemical treatment chamber 1221.

Substrate holder 1240 can comprise a chamber mating assembly (not shown) which couples the substrate holder 1240 to the chemical treatment chamber 1221, an insulating assembly (not shown), and a temperature control assembly (not shown). The chamber mating and temperature control assemblies can, for example, be fabricated from an electrically and thermally conducting material such as aluminum, stainless steel, nickel, etc. The insulating means can, for example, be fabricated from a thermally-resistant material having a relatively lower thermal conductivity such as quartz, alumina, Teflon, etc.

The substrate holder 1240 can further comprise a thermal insulation gap (not shown) in order to provide additional thermal insulation between one or more components. For example, a thermal insulation gap can be filled or evacuated in order to vary its thermal conductivity.

The substrate holder 1240 can further comprise a lift pin assembly (not shown) that is capable of raising and lowering three or more lift pins in order to vertically translate the substrate to and from an upper surface of the substrate holder and a transfer plane in the processing system.

The temperature of the temperature-controlled substrate holder 1240 can be monitored using a temperature sensing device (not shown) such as a thermocouple (e.g. a K-type thermocouple, Pt sensor, etc.). Furthermore, a controller can utilize the temperature measurement as feedback to the substrate holder assembly 1244 in order to control the temperature of substrate holder 1240. For example, at least one of a fluid flow rate, fluid temperature, heat transfer gas type, heat transfer gas pressure, clamping force, resistive heater element current or voltage, thermoelectric device current or polarity, etc. can be adjusted in order to affect a change in the temperature of substrate holder 1240.

Figure 18:
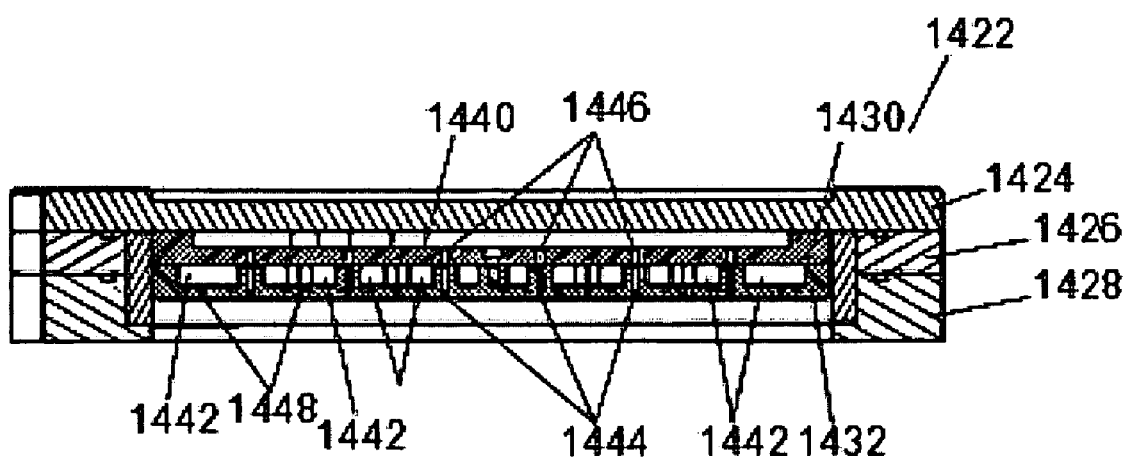
FIG. 18 illustrates a schematic cross-sectional view of a gas distribution system according to an embodiment of the present invention.

Referring again to FIGS. 15 and 16, chemical treatment system 1220 comprises a gas distribution system 1260. A gas supply system (not shown) can be coupled to gas distribution system 1260. In one embodiment, as shown in FIG. 18, a gas distribution system 1260 for distributing a process gas comprising at least two gases comprises a gas distribution assembly 1422 having one or more components 1424, 1426, and 1428, a first gas distribution plate 1430 coupled to the gas distribution assembly 1422 and configured to couple a first gas to the process space of chemical treatment chamber 1221, and a second gas distribution plate 1432 coupled to the first gas distribution plate 1430 and configured to couple a second gas to the process space of chemical treatment chamber 1221. The first gas distribution plate 1430, when coupled to the gas distribution assembly 1422, forms a first gas distribution plenum 1440. Additionally, the second gas distribution plate 1432, when coupled to the first gas distribution plate 1430 forms a second gas distribution plenum 1442. Although not shown, gas distribution plenums 1440, 1442 can comprise one or more gas distribution baffle plates. The second gas distribution plate 1432 further comprises a first array of one or more orifices 1444 coupled to and coincident with an array of one or more passages 1446 formed within the first gas distribution plate 1430, and a second array of one or more orifices 1448. The first array of one or more orifices 1444, in conjunction with the array of one or more passages 1446, are configured to distribute the first gas from the first gas distribution plenum 1440 to the process space of chemical treatment chamber 1221. The second array of one or more orifices 1448 is configured to distribute the second gas from the second gas distribution plenum 1442 to the process space of chemical treatment chamber 1221. The process gas can, for example, comprise $NH_3$, HF, $H_2$, $O_2$, CO, $CO_2$, Ar, He, etc. Each orifice 1444, 1448 comprises a diameter and a length, wherein the diameter can range from approximately 0.1 mm to approximately 10 cm, and the length cans range from approximately 0.5 mm to approximately 5 cm. As a result of this arrangement, the first gas and the second gas are independently introduced to the process space without any interaction except in the process space.

The first gas can be coupled to the first gas distribution plenum 1440 through a first gas supply passage (not shown) formed within the gas distribution assembly 1422. Additionally, the second gas can be coupled to the second gas distribution plenum 1442 through a second gas supply passage (not shown) formed within the gas distribution assembly 1422.

Referring again to FIGS. 15 and 16, chemical treatment system 1220 further comprises a temperature controlled chemical treatment chamber 1221 that is maintained at a controlled temperature. For example, a wall heating element 1266 can be coupled to a wall temperature control unit 1268, and the wall heating element 1266 can be configured to couple to the chemical treatment chamber 1221. The heating element can, for example, comprise a resistive heater element such as a tungsten, nickel-chromium alloy, aluminum-iron alloy, aluminum nitride, etc., filament. When an electrical current flows through the filament, power is dissipated as heat, and, therefore, the wall temperature control unit 1268 can, for example, comprise a controllable DC power supply. For example, wall heating element 1266 can comprise at least one Firerod cartridge heater commercially available from Watlow (1310 Kingsland Dr., Batavia, Ill., 60510). A cooling element can also be employed in chemical treatment chamber 1221. The temperature of the chemical treatment chamber 1221 can be monitored using a temperature-sensing device such as a thermocouple (e.g. a K-type thermocouple, Pt sensor, etc.). Furthermore, a controller can utilize the temperature measurement as feedback to the wall temperature control unit 1268 in order to control the temperature of the chemical treatment chamber 1221.

Referring again to FIG. 16, chemical treatment system 1220 can further comprise a temperature controlled gas distribution system 1260 that can be maintained at any selected temperature. For example, a gas distribution heating element 1267 can be coupled to a gas distribution system temperature control unit 1269, and the gas distribution heating element 1267 can be configured to couple to the gas distribution system 1260. The heating element can, for example, comprise a resistive heater element such as a tungsten, nickel-chromium alloy, aluminum-iron alloy, aluminum nitride, etc., filament. When an electrical current flows through the filament, power is dissipated as heat, and, therefore, the gas distribution system temperature control unit 1269 can, for example, comprise a controllable DC power supply. For example, gas distribution heating element 1267 can comprise a dual-zone silicone rubber heater (1.0 mm thick) capable of 1400 W (or power density of 5 W/in$^2$). The temperature of the gas distribution system 1260 can be monitored using a temperature-sensing device such as a thermocouple (e.g. a K-type thermocouple, Pt sensor, etc.). Furthermore, a controller can utilize the temperature measurement as feedback to the gas distribution system temperature control unit 1269 in order to control the temperature of the gas distribution system 1260. Alternatively, or in addition, cooling elements can be employed in any of the embodiments.

Referring still to FIGS. 15 and 16, vacuum pumping system 1250 can comprise a vacuum pump 1252 and a gate valve 1254 for throttling the chamber pressure. Vacuum pump 1252 can include a turbo-molecular vacuum pump (TMP) capable of a pumping speed up to 5000 liters per second (and greater). For example, the TMP can be a Seiko STP-A803 vacuum pump, or an Ebara ET1301W vacuum pump. TMPs are useful for low pressure processing, typically less than 50 mTorr. For high pressure (i.e., greater than 100 mTorr) or low throughput processing (i.e., no gas flow), a mechanical booster pump and dry roughing pump can be used.

Referring again to FIG. 16, chemical treatment system 1220 can further comprise a controller 1235 having a microprocessor, memory, and a digital I/O port capable of generating control voltages sufficient to communicate and activate inputs to chemical treatment system 1220 as well as monitor outputs from chemical treatment system 1220 such as temperature and pressure sensing devices. Moreover, controller 1235 can be coupled to and can exchange information with substrate holder assembly 1244, gas distribution system 1260, vacuum pumping system 1250, gate valve assembly 1296, wall temperature control unit 1268, and gas distribution system temperature control unit 1269. For example, a program stored in the memory can be utilized to activate the inputs to the aforementioned components of chemical treatment system 1220 according to a process recipe.

In an alternate embodiment, a chemical treatment system 1220 can further comprise an optical viewport (not shown), and at least one pressure sensing device (not shown).

As described in FIGS. 15 and 17, the thermal treatment system 1210 further comprises a temperature controlled substrate holder 1270. The substrate holder 1270 comprises a pedestal 1272 thermally insulated from the thermal treatment chamber 1211 using a thermal barrier 1274. For example, the substrate holder 1270 can be fabricated from aluminum, stainless steel, or nickel, and the thermal barrier 1274 can be fabricated from a thermal insulator such as Teflon, alumina, or quartz. The substrate holder 1270 further comprises a heating element 1276 embedded therein and a substrate holder temperature control unit 1278 coupled thereto. The heating element 1276 can, for example, comprise a resistive heater element such as a tungsten, nickel-chromium alloy, aluminum-iron alloy, aluminum nitride, etc., filament. When an electrical current flows through the filament, power is dissipated as heat, and, therefore, the substrate holder temperature control unit 1278 can, for example, comprise a controllable DC power supply. Alternately, the heated substrate holder 1270 can, for example, be a cast-in heater commercially available from Watlow (1310 Kingsland Dr., Batavia, Ill., 60510) capable of a maximum operating temperature of 400 to 450 C, or a film heater comprising aluminum nitride materials that is also commercially available from Watlow and capable of operating temperatures as high as 300 C and power densities of up to 23.25 W/cm$^2$. Alternatively, a cooling element can be incorporated in substrate holder 1270.

The temperature of the substrate holder 1270 can be monitored using a temperature-sensing device such as a thermocouple (e.g. a K-type thermocouple). Furthermore, a controller can utilize the temperature measurement as feedback to the substrate holder temperature control unit 1278 in order to control the temperature of the substrate holder 1270.

Additionally, the substrate temperature can be monitored using a temperature-sensing device such as an optical fiber thermometer commercially available from Advanced Energies, Inc. (1625 Sharp Point Drive, Fort Collins, Colo., 80525), Model No. OR2000F capable of measurements from 50 to 2000 C and an accuracy of plus or minus 1.5 C, or a band-edge temperature measurement system as described in pending U.S. patent application Ser. No. 10/168,544, filed on Jul. 2, 2002, the contents of which are incorporated herein by reference in their entirety.

Referring again to FIG. 17, thermal treatment system 1210 further comprises a temperature controlled thermal treatment chamber 1211 that is maintained at a selected temperature. For example, a thermal wall heating element 1283 can be coupled to a thermal wall temperature control unit 1281, and the thermal wall heating element 1283 can be configured to couple to the thermal treatment chamber 1211. The heating element can, for example, comprise a resistive heater element such as a tungsten, nickel-chromium alloy, aluminum-iron alloy, aluminum nitride, etc., filament. When an electrical current flows through the filament, power is dissipated as heat, and, therefore, the thermal wall temperature control unit 1281 can, for example, comprise a controllable DC power supply. For example, thermal wall heating element 1283 can comprise at least one Firerod cartridge heater commercially available from Watlow (1310 Kingsland Dr., Batavia, Ill., 60510). Alternatively, or in addition, cooling elements may be employed in thermal treatment chamber 1211. The temperature of the thermal treatment chamber 1211 can be monitored using a temperature-sensing device such as a thermocouple (e.g. a K-type thermocouple, Pt sensor, etc.). Furthermore, a controller can utilize the temperature measurement as feedback to the thermal wall temperature control unit 1281 in order to control the temperature of the thermal treatment chamber 1211.

Referring still to FIGS. 15 and 17, thermal treatment system 1210 further comprises an upper assembly 1284. The upper assembly 1284 can, for example, comprise a gas injection system for introducing a purge gas, process gas, or cleaning gas to the thermal treatment chamber 1211.

Referring again to FIG. 17, thermal treatment system 1210 can further comprise a temperature controlled upper assembly 1284 that can be maintained at a selected temperature. For example, an upper assembly heating element 1285 can be coupled to an upper assembly temperature control unit 1286, and the upper assembly heating element 1285 can be configured to control the temperature of the upper assembly 1284.

The heating element can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). When an electrical current flows through the filament, power is dissipated as heat, and, therefore, the upper assembly temperature control unit 1286 can, for example, comprise a controllable DC power supply. For example, upper assembly heating element 1285 can comprise a dual-zone silicone rubber heater (1.0 mm thick) capable of 1400 W (or power density of 5 W/in$^2$). The temperature of the upper assembly 1284 can be monitored using a temperature-sensing device such as a thermocouple (e.g. a K-type thermocouple, Pt sensor, etc.). Furthermore, a controller can utilize the temperature measurement as feedback to the upper assembly temperature control unit 1286 in order to control the temperature of the upper assembly 1284. In an alternate embodiment, the upper assembly 1284 can comprise a radiant heater such as an array of tungsten halogen lamps. Upper assembly 1284 may additionally or alternatively include a cooling element.

Referring again to FIGS. 15 and 17, thermal treatment system 1210 further comprises a substrate lifter assembly 1290. The substrate lifter assembly 1290 is configured to lower a substrate 1242' to an upper surface of the substrate holder 1270, as well as raise a substrate 1242" from an upper surface of the substrate holder 1270 to a holding plane, or a transfer plane therebetween. At the transfer plane, substrate 1242" can be exchanged with a transfer system utilized to transfer substrates into and out of the chemical and thermal treatment chambers 1221, 1211. At the holding plane, substrate 1242" can be cooled while another substrate is exchanged between the transfer system and the chemical and thermal treatment chambers 1221, 1211.

Referring still to FIGS. 15 and 17, thermal treatment system 1210 further comprises a vacuum pumping system 1280. Vacuum pumping system 1280 can comprise a vacuum pump, and a throttle valve such as a gate valve or butterfly valve. The vacuum pump can include a turbo-molecular vacuum pump (TMP) capable of a pumping speed up to 5000 liters per second (and greater). TMPs are useful for low pressure processing, typically less than 50 mTorr. For high pressure processing (i.e., greater than 100 mTorr), a mechanical booster pump and dry roughing pump can be used.

Referring again to FIG. 17, thermal treatment system 1210 can further comprise a controller 1275 having a microprocessor, memory, and a digital I/O port capable of generating control voltages sufficient to communicate and activate inputs to thermal treatment system 1210 as well as monitor outputs from thermal treatment system 1210. Moreover, controller 1275 can be coupled to and can exchange information with substrate holder temperature control unit 1278, upper assembly temperature control unit 1286, upper assembly 1284, thermal wall temperature control unit 1281, vacuum pumping system 1280, and substrate lifter assembly 1290. For example, a program stored in the memory can be utilized to activate the inputs to the aforementioned components of thermal treatment system 1210 according to a process recipe. One example of controller 1275 is a DELL PRECISION WORKSTATION 610™, available from Dell Corporation, Austin, Tex.

In an alternate embodiment, controllers 1235 and 1275 can be the same controller.

Additionally, the thermal treatment system 1210' further comprises a substrate detection system (not shown) in order to identify whether a substrate is located in the holding plane. The substrate detection system can, for example, comprise a Keyence (headquarters in Osaka, Japan) digital laser sensor.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of processing a substrate by chemical oxide removal (COR) comprising:
   determining a desired state for the substrate, wherein the desired state comprises target critical dimension (CD) data;
   receiving pre-process metrology data for the substrate, wherein the pre-process metrology data defines an input state for the substrate and comprises isolated CD data for at least one isolated feature and nested CD data for at least one nested feature;
   determining a process recipe for performing a chemical oxide removal (COR) process and a post-heat treatment (PHT) process by:
      comparing the input state with the desired state, wherein the isolated CD data is compared to the target CD data and the nested CD data is compared to the target CD data,
      creating at least one binning table for a trim amount space extending between a lower boundary to establish a lower limit for trimming achievable by a series of pre-qualified control recipes and an upper boundary to establish an upper limit for trimming achievable by the series of pre-qualified control recipes, said at least one binning table divides said trim amount space into a plurality of bins, each of said plurality of bins has at least one of said pre-qualified control recipes associated therewith that achieves an amount of trimming bounded by a lower trim amount boundary and an upper trim amount boundary,
      correlating a first difference between the isolated CD data and the target CD data and a second difference between the nested CD data and the target CD data with a trim amount,
      selecting a bin in said at least one binning table, wherein said trim amount is bounded by said lower trim amount boundary and said upper trim amount boundary for said bin, and
      selecting one of said pre-qualified control recipes associated with said bin as said process recipe; and
   processing the substrate to achieve the trim amount using the process recipe, the COR process including chemically treating the substrate by chemically altering exposed surface layers of an oxide hard mask on the substrate and the PHT process including thermally treating the substrate to evaporate the chemically altered exposed surface layers of the oxide hard mask.

2. The method of processing a substrate as claimed in claim 1, the method further comprising:
   receiving post-process metrology data for the substrate, wherein the post-process metrology data defines an output state and comprises post-process CD data for a processed substrate;
   determining if the desired state has been achieved by comparing said post-process CD data with said target CD data;
   determining a new process recipe when the desired state has not been achieved; and
   transferring the substrate when the desired state has been achieved.

3. The method of processing a substrate as claimed in claim 2, wherein the post-process metrology data comprises Optical Digital Profiling (ODP) data.

4. The method of processing a substrate as claimed in claim 3, wherein the post-process metrology data comprises Scanning Electron Microscope (SEM) data.

5. The method of processing a substrate as claimed in claim 1, wherein the pre-process metrology data comprises Optical Digital Profiling (ODP) data.

6. The method of processing a substrate as claimed in claim 1, wherein the pre-process metrology data comprises at least one to-be-controlled CD and the process recipe is determined by comparing the at least one to-be-controlled CD to a target CD.

7. The method of processing a substrate as claimed in claim 6, wherein the at least one to-be-controlled CD is larger than the target CD.

8. The method of processing a substrate as claimed in claim 7, wherein said process recipe comprises:
   executing a chemical oxide removal (COR) process recipe for a COR module, wherein exposed surface layers of the oxide hard mask on the substrate are chemically treated using a process gas to form a solid reaction product on at least one exposed surface layer of the oxide hard mask; and
   executing a post heat treatment (PHT) process recipe for a PHT module, wherein the solid reaction product is evaporated, thereby trimming the chemically treated exposed surface layers of the oxide hard mask.

9. The method of processing a substrate as claimed in claim 8, further comprising: repeating the COR process recipe executing and the PHT process recipe executing until the at least one to-be-controlled CD is approximately equal to the target CD.

10. The method of processing a substrate as claimed in 9, further comprising:
   receiving post-process metrology data, wherein the post-process metrology data defines an output state and comprises measured CD data for a processed substrate;
   determining if a measured CD is approximately equal to a target CD;
   repeating the COR process recipe executing and the PHT process executing when the measured CD is not approximately equal to the target CD; and stopping the execution steps when the measured CD is approximately equal to the target CD.

11. The method of processing a substrate as claimed in claim 8, wherein the executing a COR process recipe comprises:
transferring the substrate into a module comprising a chemical treatment chamber;
positioning the substrate on a temperature controlled substrate holder mounted within the chemical treatment chamber;
altering chamber pressure using a vacuum pumping system coupled to the chemical treatment chamber;
providing the process gas using a gas distribution system coupled to the chemical treatment chamber and configured to introduce at least one process gas into the chemical treatment chamber; and
controlling the COR module, the temperature controlled substrate holder, the vacuum pumping system, and the gas distribution system according to the process recipe.

12. The method of processing a substrate as claimed in claim 11, wherein the process gas comprises a fluorine-containing gas and a nitrogen-containing gas.

13. The method of processing a substrate as claimed in claim 12, wherein the process gas comprises HF and $NH_3$.

14. The method of processing a substrate as claimed in claim 11, wherein the temperature of the temperature controlled substrate holder in the chemical treatment chamber ranges from approximately 10° C. to approximately 50° C.

15. The method of processing a substrate as claimed in claim 11, wherein the temperature of the substrate mounted on the temperature controlled substrate holder in the chemical treatment chamber ranges from approximately 10° C. to approximately 50° C.

16. The method of processing a substrate as claimed in claim 11, wherein the chemical treatment chamber pressure ranges from approximately 1 mTorr to approximately 100 mTorr.

17. The method of processing a substrate as claimed in claim 11, further comprising controlling the temperature of the process gas in the gas distribution system within a range from approximately 30° C. to approximately 100° C.

18. The method of processing a substrate as claimed in claim 11, further comprising controlling the temperature of a chemical treatment chamber wall within a range from approximately 30° C. to approximately 100° C.

19. The method of processing a substrate as claimed in claim 8, wherein the executing a PHT process recipe comprises:
transferring the substrate into a module comprising a thermal treatment chamber; positioning the substrate on a temperature controlled substrate holder mounted within the thermal treatment chamber;
altering the chamber temperature using a temperature controlled upper assembly coupled to thermal treatment chamber;
altering chamber pressure using a vacuum pumping system coupled to the thermal treatment chamber; and
controlling the PHT module, the vacuum pumping system, temperature control system, and the temperature controlled substrate holder according to the process recipe.

20. The method of processing a substrate as claimed in claim 19, wherein the temperature of the temperature controlled substrate holder in the thermal treatment chamber ranges from approximately 10° C. to approximately 50° C.

21. The method of processing a substrate as claimed in claim 19, wherein the temperature of the substrate mounted on the temperature controlled substrate holder in the thermal treatment chamber ranges from approximately 10° C. to approximately 50° C.

22. The method of processing a substrate as claimed in claim 19, wherein the thermal treatment chamber pressure ranges from approximately 1 mTorr to approximately 100 mTorr.

23. The method of processing a substrate as claimed in claim 19, wherein the temperature of the thermal treatment chamber ranges from approximately 10° C. to approximately 50° C.

24. The method of processing a substrate as claimed in claim 19, further comprising: positioning the substrate at a first distance from the temperature controlled upper assembly during a first time; and positioning the substrate at a second distance from the temperature controlled upper assembly during a second time.

25. The method of processing a substrate as claimed in claim 19, further comprising controlling the temperature of a thermal treatment chamber wall within a range from approximately 30° C. to approximately 100° C.

26. The method of processing a substrate as claimed in claim 8, wherein the process gas comprises a first gas and a second gas that are independently introduced to a processing space.

27. The method of processing a substrate as claimed in claim 8, further comprising: transferring the substrate from the COR module to the PHT module.

28. The method of processing a substrate as claimed in claim 7, wherein said process recipe includes:
executing a chemical oxide removal (COR) process recipe for a COR module, wherein exposed surfaces on the substrate are chemically treated using a process gas to form a solid reaction product having a thickness approximately equal to the trim amount on at least one exposed surface; and
executing a post heat treatment (PHT) process recipe for a PHT module by evaporating the solid reaction product, thereby trimming at least one of the chemically treated exposed surfaces by the trim amount.

29. The method of processing a substrate as claimed in claim 28, further comprising: examining a number of pre-qualified control recipes, wherein each control recipe has at least one pre-determined trim value; and selecting the pre-qualified control recipe having a pre-determined trim value approximately equal to the difference between post-process CD data and target CD data.

30. The method of processing a substrate as claimed in claim 1, further comprising: creating a lookup table containing a number of pre-qualified control recipes; and performing a table lookup to determine the process recipe.

31. The method of processing a substrate as claimed in claim 1, further comprising: performing a first trimming process based on the difference between the isolated CD data and the first target CD data; and performing a second trimming process based on the difference between the nested CD data and second target CD data.

32. The method of processing a substrate as claimed in claim 1, further comprising:
determining a first delta based on the difference between said isolated CD data for the at least one isolated feature and the target CD data;
determining a second delta based on the difference between said nested CD data for the at least one nested feature and the qualified target CD data; and performing said process recipe using said trim amount based on the difference between the first delta and the second delta.

33. The method of processing a substrate as claimed in claim 1, wherein the pre-process metrology data includes goodness-of-fit (GOF) data, and depth data.

34. The method of processing a substrate as claimed in claim 1, further comprising:
receiving post-process metrology data for the substrate, wherein the post-process metrology data defines an output state and comprises CD data for a processed substrate;
computing a predicted state for the substrate based on the process characteristics and a process model;
determining if the predicted state has been achieved by comparing the output state with the predicted state; and
computing a process model offset when the predicted state has not been achieved.

35. The method of processing a substrate as claimed in claim 1, wherein the process recipe is determined by executing a control strategy and a control plan.

36. A processing system for treating a substrate comprising:
a processing subsystem comprising a chemical oxidation removal (COR) module for chemically altering exposed surface layers of an oxide hard mask on the substrate, a post heat treatment (PHT) module for thermally treating the chemically altered exposed surface layers of said oxide hard mask on the substrate, and an isolation assembly coupled between the PHT module and the COR module;
a first integrated metrology module (IMM) coupled to the processing subsystem for providing pre-process metrology data that determines an input state for the substrate, wherein the pre-process metrology data comprises isolated CD data for at least one isolated feature and nested CD data for at least one nested feature; and
a control device coupled to the processing subsystem and the first IMM, wherein the control device determines a process recipe for performing a chemical oxide removal (COR) process and a post-heat treatment (PHT) process to change the substrate from an input state to a desired state by:
comparing the input state with the desired state, wherein the isolated CD data is compared to the target CD data and the nested CD data is compared to the target CD data,
creating at least one binning table for a trim amount space extending between a lower boundary to establish a lower limit for trimming achievable by a series of pre-qualified control recipes and an upper boundary to establish an upper limit for trimming achievable by the series of pre-qualified control recipes, said at least one binning table divides said trim amount space into a plurality of bins, each of said plurality of bins has at least one of said pre-qualified control recipes associated therewith that achieves an amount of trimming bounded by a lower trim amount boundary and an upper trim amount boundary,
correlating a first difference between the isolated CD data and the target CD data and a second difference between the nested CD data and the target CD data with a trim amount,
selecting a bin in said at least one binning table, wherein said trim amount is bounded by said lower trim amount boundary and said upper trim amount boundary for said bin, and
selecting one of said pre-qualified control recipes associated with said bin as said process recipe; and
executes the process recipe to process the substrate to achieve the trim amount using the process recipe, the COR process including chemically treating the substrate in the COR module by chemically altering exposed surface layers of an oxide hard mask on the substrate and the PHT process including thermally treating the substrate in the PHT module to evaporate the chemically altered exposed surface layers of the oxide hard mask.

37. The processing system for treating a substrate as claimed in claim 36, wherein the COR module further comprises a temperature controlled chemical treatment chamber, a temperature controlled substrate holder mounted within the chemical treatment chamber and configured to be substantially thermally insulated from the chemical treatment chamber, a vacuum pumping system coupled to the chemical treatment chamber, and a temperature controlled gas distribution system for introducing one or more process gases into the chemical treatment chamber.

38. The processing system for treating a substrate as claimed in claim 37, wherein the temperature controlled chemical treatment chamber comprises a wall heating element.

39. The processing system for treating a substrate as claimed in claim 37, wherein the temperature controlled gas distribution system comprises at least one gas distribution plate, the gas distribution plate comprising one or more gas injection orifices.

40. The processing system for treating a substrate as claimed in claim 37, wherein the temperature controlled substrate holder in the chemical treatment chamber comprises at least one of an electrostatic clamping system, a back-side gas supply system, and one or more temperature control elements.

41. The processing system for treating a substrate as claimed in claim 37, wherein the temperature controlled substrate holder in the chemical treatment chamber includes one or more temperature control elements.

42. The processing system for treating a substrate as claimed in claim 37, wherein the gas distribution system comprises a first gas distribution plenum and a first gas distribution plate having a first array of one or more orifices and a second array of one or more orifices for coupling a first gas to a process space through the first array of one or more orifices in the first gas distribution plate, and a second gas distribution plenum and a second gas distribution plate having passages therein for coupling a second gas to the process space through the passages in the second gas distribution plate and the second array of one or more orifices in the first gas distribution plate.

43. The processing system for treating a substrate as claimed in claim 42, wherein the first gas and the second gas are independently introduced to the process space.

44. The processing system for treating a substrate as claimed in claim 36, wherein the PHT module further comprises a temperature controlled thermal treatment chamber, a temperature controlled substrate holder mounted within the thermal treatment chamber and configured to be substantially thermally insulated from the thermal treatment chamber, and a vacuum pumping system coupled to the thermal treatment chamber.

45. The processing system for treating a substrate as claimed in claim 44, wherein the PHT module further comprises a substrate lifter assembly coupled to the thermal treatment chamber for vertically translating the substrate between a transfer plane and the substrate holder.

46. The processing system for treating a substrate as claimed in claim 36, wherein the control device further comprises means for controlling at least one of a chemical treatment chamber temperature, a chemical treatment gas distribution system temperature, a chemical treatment substrate holder temperature, a chemical treatment substrate temperature, a chemical treatment processing pressure, a chemical treatment gas flow rate, a thermal treatment chamber temperature, a thermal treatment substrate holder temperature, a thermal treatment substrate temperature, and a thermal treatment processing pressure.

47. The processing system for treating a substrate as claimed in claim 36, wherein the isolation assembly comprises at least one of a thermal insulation assembly, a gate valve assembly, and a transfer system.

48. The processing system as recited in claim 36, wherein the processing subsystem is coupled to a manufacturing system.

49. The processing system as recited in claim 36, wherein the control device also determines if the desired state has been achieved.

* * * * *